(12) United States Patent
Owen

(10) Patent No.: US 8,149,420 B2
(45) Date of Patent: Apr. 3, 2012

(54) INTERFEROMETER CALIBRATION SYSTEM AND METHOD

(75) Inventor: Geraint Owen, Palo Alto, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 361 days.

(21) Appl. No.: 12/180,171

(22) Filed: Jul. 25, 2008

(65) Prior Publication Data
US 2010/0020330 A1    Jan. 28, 2010

(51) Int. Cl.
G01B 11/02 (2006.01)

(52) U.S. Cl. ........................................ 356/498

(58) Field of Classification Search ........... 356/496–499
See application file for complete search history.

(56) References Cited

U.S. PATENT DOCUMENTS

| | | | |
|---|---|---|---|
| 7,440,113 | B2 | 10/2008 | Trutna et al. |
| 2006/0227332 | A1 | 10/2006 | Eussen et al. |
| 2008/0074681 | A1 | 3/2008 | Loopstra et al. |
| 2008/0106722 | A1* | 5/2008 | Shibazaki ................ 355/75 |
| 2008/0225262 | A1 | 9/2008 | Schluchter et al. |

OTHER PUBLICATIONS

English translation of Koyabu et al JP 07-190741.*
Octrooicentrum Nederland, Search Report, Dec. 4, 2009.
Agilent Technologies, Inc., Displacement Measurement Sensor Head and System Having Measurement Sub-Beams Comprizing Zeroth Order and First Order Diffraction Components. USPTO pending U.S. Appl. No. 12/172,810, filed Jul. 14, 2008.
U.S. Appl. No. 12/172,810, filed Jul. 14, 2008, Schluchter, William.

* cited by examiner

Primary Examiner — Tarifur Chowdhury
Assistant Examiner — Jonathon Cook

(57) ABSTRACT

A metrology system is provided comprising a diffraction grating mounted on the object, and an interferometer head operable to direct at least one measurement light beam towards the grating at a non-zero angle of incidence. With a single first separation in the second direction between the object and the interferometer head, respective displacement measurements are made at known displacements of the object. From the displacement measurements are generated respective original calibration values, each pertaining to a respective one of the known displacements. With a second separation in the second direction between the object and the interferometer head, a displacement of the object is measured. The measured displacement is corrected using an offset calibration value derived from at least one of the original calibration values and pertaining to at least one offset displacement, offset from the measured displacement.

5 Claims, 9 Drawing Sheets

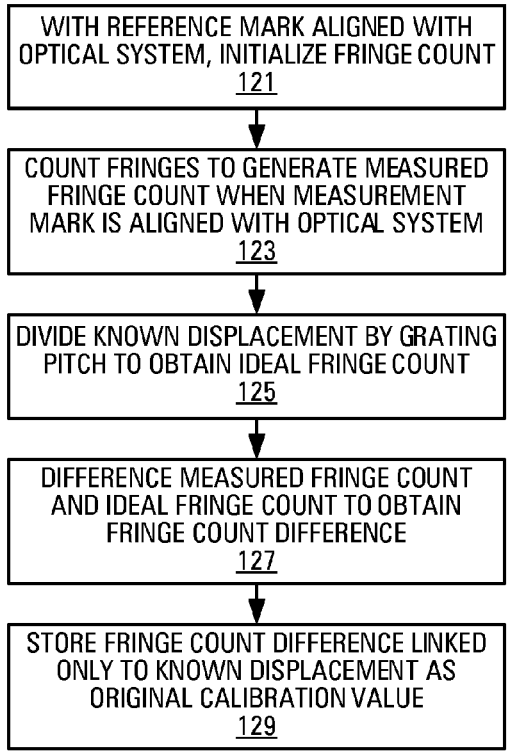
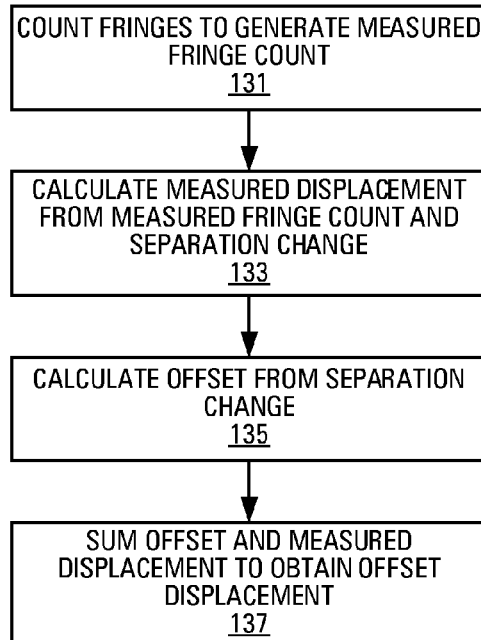
FIG.2A
FIG.2B

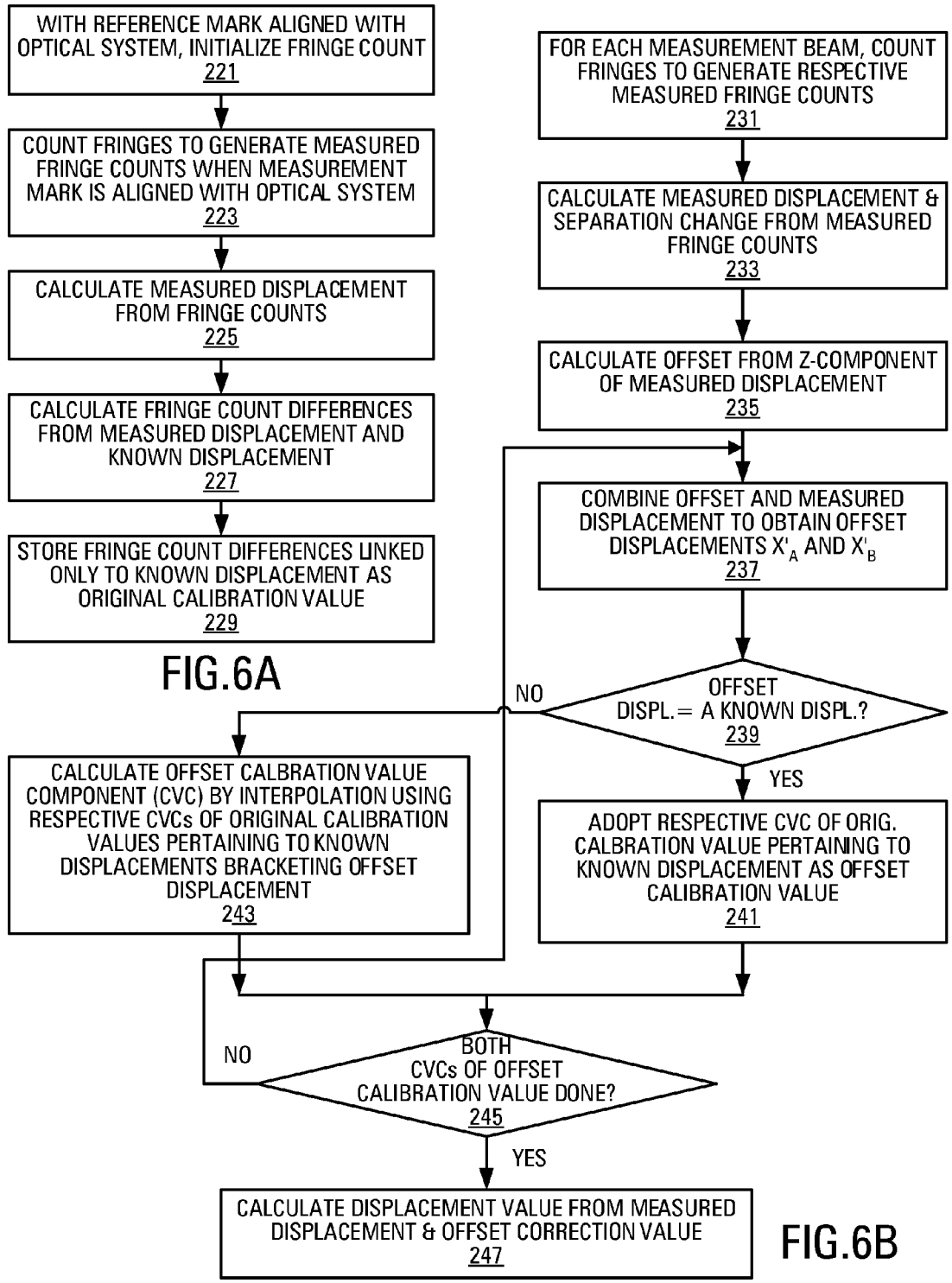

```
┌─────────────────────────────────────────────────────────┐
│   PROVIDE METROLOGY SYSTEM HAVING A DIFFRACTION GRATING │
│ MOUNTED ON THE OBJECT, AND A INTERFEROMETER OPERABLE TO │
│   DIRECT AT LEAST ONE MEASUREMENT LIGHT BEAM TOWARDS    │
│      THE GRATING AT A NON-ZERO ANGLE OF INCIDENCE       │
│                           410                            │
└─────────────────────────────────────────────────────────┘
                              │
                              ▼
┌─────────────────────────────────────────────────────────┐
│  WITH A SINGLE FIRST SEPARATION IN THE SECOND DIRECTION │
│   BETWEEN INTERFEROMETER AND GRATING, MAKE RESPECTIVE   │
│   DISPLACEMENT MEASUREMENTS AT KNOWN DISPLACEMENTS OF   │
│            THE OBJECT IN THE FIRST DIRECTION            │
│                           420                            │
└─────────────────────────────────────────────────────────┘
                              │
                              ▼
┌─────────────────────────────────────────────────────────┐
│     DERIVE RESPECTIVE ORIGINAL CALIBRATION VALUES       │
│    FROM THE DISPLACEMENT MEASUREMENTS. EACH OF THE      │
│     ORIGIONAL CALIIBRATION VALUES PERTAINS TO A         │
│         RESPECTIVE ONE OF THE KNOWN DISPLACEMENTS       │
│                           430                            │
└─────────────────────────────────────────────────────────┘
                              │
                              ▼
┌─────────────────────────────────────────────────────────┐
│  WITH A SECOND SEPARATION IN THE SECOND DIRECTION       │
│  BETWEEN INTERFEROMETER AND GRATING, MEASURE A          │
│  DISPLACEMENT OF THE OBJECT TO OBTAIN A MEASURED        │
│  DISPLACEMENT. THE SECOND SEPARATION DIFFERS FROM       │
│                  THE FIRST SEPARATION                    │
│                           440                            │
└─────────────────────────────────────────────────────────┘
                              │
                              ▼
┌─────────────────────────────────────────────────────────┐
│ CORRECT THE MEASURED DISPLACEMENT USING AN OFFSET       │
│ CALIBRATION VALUE DERIVED FROM AT LEAST ONE OF THE      │
│ ORIGINAL CALIBRATION VALUES AND PERTAINING TO AT LEAST  │
│ ONE OFFSET DISPLACEMENT. EACH OFFSET DISPLACEMENT IS    │
│           OFFSET FROM THE MEASURED DISPLACEMENT         │
│                           450                            │
└─────────────────────────────────────────────────────────┘
```

FIG.9

INTERFEROMETER CALIBRATION SYSTEM AND METHOD

BACKGROUND

Optical interferometers are often used to make accurate measurements of position. For example, in semiconductor fabrication applications, a movable stage having a wafer mounted thereon must be accurately positioned with respect to an optical system that projects a pattern image onto the surface of a wafer. Through photolithography, the pattern image defines the patterning of a constituent layer of a semiconductor device formed in a small region of the wafer. The pattern image has to be aligned very accurately with elements of the semiconductor device already formed in or on the wafer. The accuracy required of the positioning operation depends on the feature size of the pattern image. Decreasing feature sizes have driven a demand for ever more accurate positioning mechanisms, and hence, metrology systems for accurately measuring the position of the stage.

Interferometer-based position metrology systems are typically used to measure position. Interferometers typically measure displacement, i.e., a change of position. To obtain a measurement of position from a metrology system that measures displacement, the stage is initialized to an accurately-known start position and is then moved to a current position. The metrology system measures the displacement of the current position from the start position, and adds the measured displacement to the start position to obtain the current position of the stage. When the stage makes more than one movement to reach the current position, the measured displacements of all the movements are summed and the result is added to the start position to obtain the current position.

Recently, interferometer-based metrology systems of the types disclosed by Trutna, Jr. et al. in United States patent application publication no. 2007/0146722 and by Schluchter et al. in U.S. patent application Ser. Nos. 11/686,855 and 12/172,810 have been used to measure the displacements of a movable object such as a stage. All of these disclosures are assigned to the assignee of this disclosure and are incorporated herein by reference. Such metrology systems have an approximately constant optical path length between an interferometer head and the stage, and are therefore less susceptible to errors due to variations in the refractive index of air caused by variations in temperature, humidity, etc.

Although differing in details, in the above-mentioned interferometer-based metrology systems, an interferometer head directs a measurement beam of light onto a diffraction grating typically mounted on the underside of the movable stage. The measurement beam is incident on the diffraction grating at a non-zero angle of incidence. In the direction or directions in which the stage is capable of large-scale movement, the diffraction grating has a dimension greater than the maximum range of movement of the stage in that direction, and has lines extending in directions which are not parallel to each direction of movement. The diffraction grating diffracts the measurement beam back to the interferometer head. In the metrology system disclosed by Trutna, Jr. et al, the interferometer head combines the measurement beam with a reference beam reflected by a reference mirror whose position does not change. In the metrology systems disclosed by Schluchter et al, the interferometer head combines a first sub-beam derived by the diffraction grating diffracting the measurement beam at one order with a second sub-beam derived by the diffraction grating the measurement beam at another, different, order or derived by the diffraction grating diffracting another measurement beam at the same or a different order. In both metrology systems, the interference fringes that occur in the combined beam as the stage moves are counted to provide a fringe count and the fringe count is processed to provide a measure of the displacement of the stage. Optionally, the measured displacement is added to the start position of the stage to obtain a measure of the current position of the stage.

As noted above, the stage is capable of large-scale movement in a first direction. In applications such as the above-mentioned semiconductor device photolithography application, the stage is additionally capable of small-scale movement in a second direction. The second direction is typically orthogonal to the first direction and to the plane of the grating. References in this disclosure to displacement are to be taken to refer principally to the first direction. Measurement of the position or the displacement of the stage is principally of interest in the first direction. References in this disclosure to separation are to be taken to refer principally to the second direction.

In some applications, the stage is additionally capable of large-scale movement in a third direction typically mutually orthogonal to the first direction and the second direction. The first and third directions are therefore nominally coplanar with the grating. With respect to such applications, references in this disclosure to displacement are to be taken to refer principally to either or both of the first direction and the third direction. Measurement of the position or the displacement of the stage is principally of interest in the first direction and the third direction in such applications.

Imperfections in the diffraction grating impair the accuracy of the displacement measurements obtained simply by counting the fringes. The displacement measurement obtained from the fringe count does not intrinsically have the accuracy required for such applications as semiconductor device photolithography. To reach the required accuracy, the metrology systems have to be calibrated. The metrology systems are sufficiently precise that, after they are calibrated, they can consistently provide the accuracy needed for such applications as semiconductor device photolithography with feature sizes as small as a few tens of nanometers.

The metrology system is calibrated by mounting a special calibration wafer on the stage. The calibration wafer has an array of fiducial marks arrayed on its major surface at accurately-known displacements from one another. Calibration involves moving the stage to precisely align each of the fiducial marks with the optical system of the host photolithography apparatus and measuring the displacement of the stage using the metrology system. Differencing the known displacement and the measurement displacement yields a calibration value pertaining to the known displacement. The need to precisely align each of a large number of fiducial marks with the optical system during the calibration process makes the calibration process very time consuming. Time spent calibrating the metrology system is time in which the photolithography apparatus cannot be used to process production wafers.

Additionally, when the stage is additionally capable of small-scale movement in the second direction, since the calibration values depend not only on the displacement in the first direction but also on separation in the second direction, the above-described calibration process has to be repeated at a number of different separations between the stage and the interferometer head. The need to perform the calibration process several times to complete the calibration of the metrology system multiplies the time needed to calibrate a conventional metrology system.

What is needed, therefore, is a metrology method and system having a substantially reduced calibration time.

BRIEF DESCRIPTION OF THE DRAWINGS

FIG. 2A is a flow chart showing an example of the processing performed by the processor in the calibration mode of the metrology system shown in FIG. 1.

FIG. 2B is a flow chart showing an example of the processing performed by the processor in the writing mode of the metrology system shown in FIG. 1.

FIG. 6A is a flow chart showing an example of the processing performed by the processor in the calibration mode of the metrology system shown in FIG. 4.

FIG. 6B is a flow chart showing an example of the processing performed by the processor in the writing mode of the metrology system shown in FIG. 4.

FIG. 9 is a flow chart showing an example of an interferometer-based metrology method in accordance with an embodiment of the invention.

DETAILED DESCRIPTION

Figure 1:
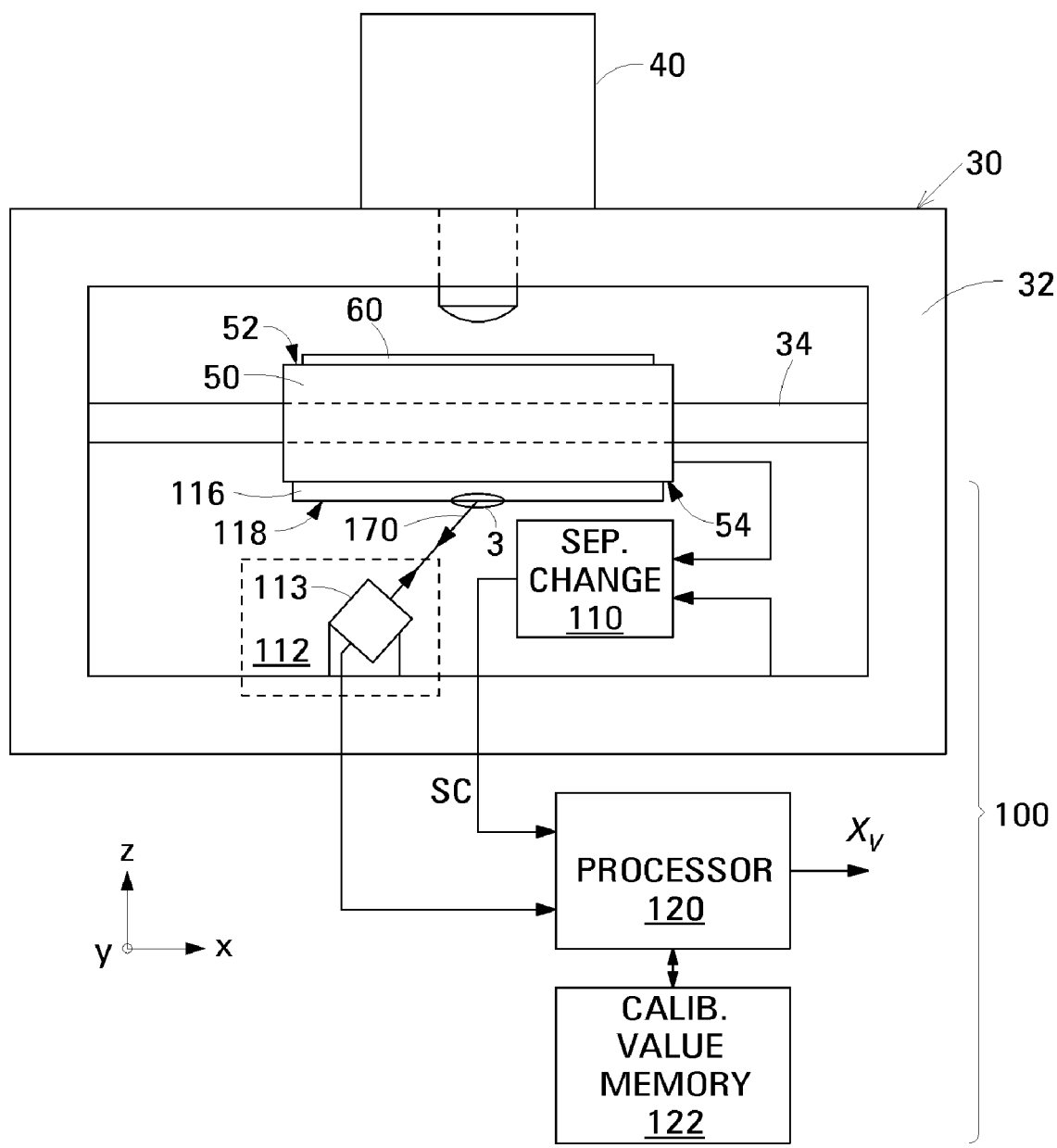
FIG. 1 is a schematic diagram showing an example of a metrology system in accordance with an embodiment of the invention.

FIG. 1 is a schematic diagram showing an example of a metrology system 100 in accordance with an embodiment of the invention. Metrology system 100 is based on an interferometer-based metrology system of the type described in above-mentioned United States patent application publication no. 2007/0146722. An example incorporating an embodiment of a metrology system of the type described in above-mentioned U.S. patent application Ser. Nos. 11/686,855 and 12/172,810 would look similar except for the paths of the measurement beams. Metrology system 100 is primarily for use in applications in which the object whose displacement metrology system 100 measures is capable of large-scale movement at least in a first direction and is additionally capable of small-scale movement in a second direction. Metrology system 100 requires calibration, but the calibration is performed with no more than one separation between the object and the interferometer head in the second direction. Thus, metrology system 100 has a substantially reduced calibration time compared with a metrology system that requires calibrating at several different separations between the object and the interferometer head.

In the example shown in FIG. 1, metrology system 100 is shown measuring the displacement of the stage of an example of a photolithography apparatus 30. Photolithography apparatus 30 is composed of an armature 32 that supports other elements of the apparatus, including a rail 34, an interferometer head 112 and an optical system 40. Rail 34 extends in the x-direction. A stage 50 is mounted on rail 34 such that it is capable of large-scale movement in the x-direction. Metrology system 100 determines the displacement, and, optionally, the position, of stage 50 in the x-direction. Stage 50 is additionally capable of small-scale movement in the z-direction, orthogonal to the x-direction. In other examples, stage 50 is capable of small-scale movement in a second direction that is not necessarily orthogonal to the x-direction.

Stage 50 has a first major surface 52 on which a wafer subject to photolithography is mounted during normal operation of photolithography apparatus 30. Such wafer will be referred to as a production wafer. The production wafer is not shown in FIG. 1, but its location on major surface 52 is the same as that of a special calibration wafer 60 shown in FIG. 1. Stage 50 additionally has a second major surface 54 opposite and nominally parallel to first major surface 52. Major surfaces 52, 54 are nominally parallel to rail 34. A diffraction grating 116 is mounted on major surface 54 such that its diffractive surface is parallel to major surface 54 and faces away therefrom. The diffraction grating has a dimension somewhat greater than the maximum range of movement of stage 50 in each direction in which stage 50 is capable of large-scale movement. In the example shown, in which stage 50 is capable of large-scale movement only in the x-direction, grating 116 is a one-dimensional grating with lines extending in the y-direction.

Metrology system 100 is composed of a separation change detector 110, interferometer head 112, a processor 120, a calibration value memory 122 and diffraction grating 116. Interferometer head 112 is composed of a single interferometer assembly 113. A typical example of interferometer assembly 113 is composed of a polarizing beam splitter, a light source, a light detector, a retroreflector and two polarization changing elements. Since examples of interferometer assembly 113 are described in detail in United States patent application publication no. 2007/0146722, interferometer assembly 113 will not be described in further detail here.

Interferometer head 112 directs a measurement beam 170 towards grating 116. Specifically, interferometer assembly 113 directs measurement beam 170 towards grating 116 such that measurement beam 170 is incident on grating 116 at a non-zero angle of incidence. In the example shown, to simplify the following description, interferometer assembly 113 is a single-pass interferometer assembly that directs measurement beam 170 towards grating 116 only once. In other examples, interferometer assembly 113 is a double-pass interferometer assembly that directs measurement beam 170 towards grating 116 twice. In the example shown, interferometer assembly 113, diffraction grating 116 and part of the processing performed by processor 120 constitute a Littrow interferometer that measures the displacement of stage 50 in the x-direction and that is additionally responsive to changes in separation in the z-direction between stage 50 and interferometer head 112. Interferometer head 112 and diffraction grating 116 may alternatively be configured as described in above-mentioned U.S. patent application Ser. No. 11/686, 855 or in above-mentioned U.S. patent application Ser. No. 12/172,810.

Measurement beam 170 directed towards diffraction grating 116 by interferometer assembly 113 has an angle of incidence of α on grating 116. In this disclosure, angles of incidence, reflection, refraction and diffraction are measured relative to a normal to the surface. In the example, the angle of incidence is equal to the Littrow angle of diffraction grating 116. At an angle of incidence equal to the Littrow angle, the angle of diffraction is equal to the angle of incidence. Consequently, diffraction grating 116 diffracts measurement beam 170 back towards interferometer head 112 along a reciprocal path. Littrow angle α, the wavelength λ of measurement beam 170 and the pitch p of grating 116 are related by the equation:

$$\lambda = 2p \sin \alpha.$$

Within interferometer head 112, interferometer assembly 113 superposes measurement beam 170 and a reference beam (not shown) on a photodetector (not shown) that generates an electrical signal. The electrical signal represents the intensity of the light beams incident on the photodetector. Due to interference between the measurement beam and the reference beam, the amplitude of the electrical signal varies approximately sinusoidally as stage 50 moves. The electrical signal is output to processor 120. In processor 120, the electrical signal is converted to a digital signal. Processor 120 generates what will be referred to herein as a fringe count by counting the number of cycles of the electrical signal represented by the digital signal as stage 50 moves from its start position to a current position. The fringe count has an integer portion and a fractional portion. The integer portion represents the number of complete cycles the electrical signal undergoes as stage 50 moves. The fractional portion represents the difference in magnitude and sign of the electrical signal between the start position and the current position of the stage. In some embodiments, the fractional portion has a resolution as small as $10^{-4}$ of one cycle.

Separation change detector 110 detects changes in the separation in the z-direction between stage 50 and interferometer head 112 and outputs a separation change signal SC that quantifies such change. Separation change signal SC is an electrical signal that quantifies the change in separation of stage 50 in the z-direction between its start position and its current position. Separation change signal SC is typically a digital electrical signal. In an example that will be described in detail below with reference to FIG. 4, separation change detector 110 is composed of interferometer assembly 113, an additional interferometer assembly 213 similar to interferometer assembly 113 and processing performed by a processor 220. In other examples, separation change detector 110 comprises a capacitative sensor, an optical sensor, an electro-mechanical sensor or another suitable type of sensor capable of generating an electrical signal that quantifies relatively small changes in separation with an accuracy of the same order as that with which metrology system 100 is specified to measure displacement. In yet other examples, separation change detector 110 extracts a separation-dependent electrical signal from the focusing servo (not shown) of photolithography apparatus 30 to provide separation change signal SC.

Processor 120 determines the displacement of grating 116, and, hence of stage 50, to provide a measured displacement. Processor 120 determines the displacement in response to the fringe count N it generates in response to the electrical signal output by interferometer assembly 113 and additionally in response to separation change signal SC it receives from separation change detector 110 as stage 50 moves from its start position to its current position. Processor 120 uses the following equation to calculate the displacement x of stage 50 from fringe count N and the change in separation of stage 50 represented by separation-change signal SC:

$$x = pN - \Delta z \cot \alpha$$

where p is the pitch of grating 116, α is the angle of incidence of measurement beam 170 on grating 116 and Δz is the change in separation of stage 50 represented by separation change signal SC.

The measured displacement calculated by processor 120 from the fringe count and separation change signal SC is precise but not necessarily accurate. Due to imperfections in diffraction grating 116, the measured displacement is of insufficient accuracy, and therefore must be corrected to generate a displacement value that quantifies the displacement of stage 50 with greater accuracy than the measured displacement.

Metrology system 100 can be regarded as having two operational modes, a calibration mode and a writing mode. In the calibration mode, metrology system 100 operates to generate calibration values and store them in calibration value memory 122. Calibration value memory 122 is typically a non-volatile memory. Because metrology systems and metrology methods in accordance with various embodiments of the invention derive offset calibration values from the calibration values generated in calibration mode, the calibration values generated in calibration mode and stored in calibration value memory 122 will be referred to as original calibration values to distinguish them from the offset calibration values that are used in writing mode to correct the measured displacement.

In the writing mode of metrology system 100, each measured displacement is corrected using an offset calibration value derived from at least one the original calibration values. Correcting the measured displacement using the offset calibration value provides a displacement value that quantifies the displacement of stage 50 with a required accuracy. In metrology system 100, the offset calibration value pertains to a single offset displacement offset from the measured displacement by an offset that depends on the separation change.

To calibrate metrology system 100, special calibration wafer 60 is mounted on the first major surface 52 of stage 50. Calibration wafer 60 has an array of fiducial marks on the major surface thereof. Adjacent ones of the fiducial marks are displaced from one another by a displacement typically of 5 mm. A one-dimensional array is sufficient to calibrate the example of photolithography apparatus 30 shown in FIG. 1. A two-dimensional array is needed to calibrate an example of photolithography apparatus 30 in which stage 50 is capable of large-scale movement in two directions. One of the fiducial marks is a reference mark, the remainder of the fiducial marks will be referred to as measurement marks. The displacement of each measurement mark from the reference mark in at least the x-direction is known to an accuracy substantially better than the specified accuracy of photolithography apparatus 30. During calibration of metrology system 100, optical system 40 operates in an imaging mode in which it forms an image on the surface of calibration wafer 60 on which the fiducial marks are located. Additionally, in imaging mode, optical system 40 superimposes on the image a real or virtual pair of crosshairs having an accurately defined location relative to armature 32. In imaging mode, the image with the crosshairs superimposed thereon can be observed by means of a suitable eyepiece or, more typically, by means of a video camera and monitor.

Stage 50 is then moved to its start position. Specifically, stage 50 is moved in the x-direction to precisely align the reference mark with crosshairs (not shown) of optical system 40 and is additionally moved in the z-direction to a predetermined separation from interferometer head 112. To simplify the following explanation, a fiducial mark that is aligned with the crosshairs of optical system 40 will be said to be aligned with optical system 40. Stage 50 is then moved in the x-direction from its start position to align one of the measurement marks with optical system 40 and metrology system 100 measures the resulting displacement of stage 50 in the x-direction to provide a measured displacement. A calibration value pertaining to the known displacement of the measurement mark from the reference mark is then calculated by differencing the known displacement and the measured displacement. The process just described is then repeated using the remaining measurement marks to determine a calibration value pertaining the known displacement of each measurement mark on calibration wafer 60. The calibration process is performed with no more than a single separation in the z-direction between stage 50 and interferometer head 112. Consequently, the calibration process generates no more than the single set of original calibration values that pertains to no more than a single separation in the z-direction between stage 50 and interferometer head 112. In the example just described, the single separation at which the calibration process is performed is that which corresponds to the z-direction component of the start position of stage 50. In other examples, the single separation at which the calibration process is performed differs by an accurately-known separation difference in the z-direction from the start position.

The single set of original calibration values generated by metrology system 100 in calibration mode is composed of a calibration value pertaining to the known displacement of each of the measurement marks on calibration wafer 60. Each calibration value is a single fringe count difference that represents the difference between the fringe count measured by metrology system 100 and an ideal fringe count calculated by dividing the known displacement of the measurement mark by the pitch p of grating 116.

FIG. 2A is a flow chart showing an example of the processing performed by processor 120 in the calibration mode of metrology system 100. Referring additionally to FIG. 1, at the start of the calibration process, metrology system 100 is initialized by moving stage 50 in the x-direction to align the reference mark on calibration wafer 60 with optical system 40. Stage 50 is additionally moved in the z-direction to the separation at which the calibration process will be performed. In block 121, with stage 50 positioned as just described, the fringe count generated by processor 120 is initialized. For example, the fringe count is set to zero. Stage 50 is then moved in the x-direction only to align one of the measurement marks on calibration wafer 60 with optical system 40. As stage 50 moves, processor 120 counts the fringes represented by the electrical signal received from interferometer assembly 113. In block 123, processor 120 generates a measured fringe count when the measurement mark is aligned with optical system 40.

In block 125, processor 120 divides the known displacement of the measurement mark aligned with optical system 40 from the reference mark by the pitch of grating 116 to obtain an ideal fringe count. The known displacement of each of the measurement marks from the reference mark is typically stored in a memory (not shown) that can be accessed by processor 120. Alternatively, the known displacement may be input to processor 120 by a human operator. The known displacements have units of length, typically the same units of length as are used to define the locations of the semiconductor devices on the production wafer. In a further alternative, the known displacements of the measurement marks on calibration wafer 60 are converted to ideal fringe counts in advance and the ideal fringe counts are stored in a memory (not shown) that can be accessed by processor 120. In this case, block 125 can be omitted.

In block 127, processor 120 differences the measured fringe count and the ideal fringe count pertaining to the measurement mark aligned with optical system 40 to obtain a fringe count difference. In block 129, processor 120 stores the fringe count difference linked only to the known displacement of the measurement mark in calibration value memory 122 as an original calibration value pertaining to the known displacement. Processor 120 performs the measurement mark processing just described for each of the measurement marks aligned with optical system 40. The measurement mark processing just described may be performed as each measurement mark is aligned with optical system 40. Alternatively, processor 120 performs block 123 as each measurement mark is aligned with optical system 40 and stores the resulting measured fringe count. After all the measured fringe counts have been stored, processor 120 performs blocks 125, 127 and 129 for each of the stored measured fringe counts to generate respective fringe count differences as respective calibration values.

Referring again to FIG. 1, in the writing mode of metrology system 100, a production wafer (not shown) is substituted for calibration wafer 60 on the first surface 52 of stage 50. Optical system 40 is set to a pattern projection mode in which the optical system can be regarded as projecting an image of the patterning of a layer of a semiconductor device being formed on the production wafer onto a small region of the major surface of the wafer. The region is the region of the wafer in which a single semiconductor device is formed. Such region is typically rectangular with sides that range from about 2 mm to about 25 mm or more in length. The location of the region of the wafer surface on which the pattern image is projected is determined from a displacement value output by metrology system 100. The wafer has to be positioned so that the pattern image is aligned with patterns previously defined in or on the wafer. The alignment has to be performed with an accuracy of a fraction of a nanometer to a few nanometers, yet the range of movement of stage 50 can be as large as a few hundred millimeters.

Since the surface of the production wafer is not necessarily parallel to the major surface 52 of stage 50 due to the thickness and flatness of the wafer being different at different displacements in the x-direction, stage 50 is additionally capable of small-scale movement in the z-direction relative to rail 34, as described above. Stage 50 moves in the z-direction to focus the pattern mage projected on the major surface of the wafer notwithstanding variations in the distance in the z-direction of the major surface of the wafer from major surface 52. Such movement of stage 50 in the z-direction relative to rail 34 changes the separation in the z-direction between stage 50 and interferometer head 112. Unless grating 116 is perfect, which typically it is not because otherwise a perfect grating would not require calibration, the change in separation in the z-direction changes the displacement measurement made by metrology system 100 in the x-direction.

Stage 50 is first moved in the x-direction and, if necessary, in the z-direction, to its start position. Stage 50 is next moved in the x-direction towards a target displacement at which a feature defined in and on the production wafer is accurately aligned with the pattern image projected by optical system 40 in its projection mode. Stage 50 is additionally moved in the z-direction to focus the pattern image on the surface of the production wafer. In response to movement of stage 50 in the z-direction, separation change detector 110 generates separation change signal SC that represents the change in separation in the z-direction between the start position and the current position of stage 50 and outputs the separation change signal to processor 120.

Additionally, as stage 50 moves, and in response to the electrical signal output by interferometer assembly 113 and separation change signal SC, metrology system 100 generates displacement values that accurately quantify the displacement of stage 50. The displacement values are fed back to the positioning servo (not shown) that constitutes part of photolithography apparatus 30 and controls the movement of stage 50. Specifically, processor 120 counts the interference fringes represented by the electrical signal output by interferometer assembly 113 to obtain respective a fringe count, and, in response to the fringe count and separation change signal SC, measures the displacement of stage 50 to provide a measured displacement. The measured displacement calculated from the fringe count and separation change signal SC is precise but, due to imperfections in diffraction grating 116, it is of insufficient accuracy, and therefore must be corrected using an offset calibration value derived from at least one of the above-described original calibration values. Correcting the measured displacement using the offset calibration value generates the displacement value that accurately quantifies the displacement of the stage. The measured displacement is a two-dimensional (x, z) value.

Processor 120 additionally uses separation difference signal SC to determine the offset displacement offset in the x-direction from the measured displacement. Processor 120 uses the offset displacement to derive the offset calibration value from one or more of the original calibration values in the single set of calibration values obtained in the calibration mode of metrology system 100 and stored in calibration value memory 122. The offset calibration value is unique to metrology systems and metrology methods in accordance with various embodiments of the invention. In metrology system 100, the offset calibration value pertains to a single offset displacement offset in the x-direction from the measured displacement. The offset depends on the change in separation between calibration mode and writing mode. The one or more original calibration values from which the offset calibration value is derived are those pertaining to respective known displacements closest to the offset displacement. Correcting the measured displacement using an offset calibration value that depends on the separation change enables a single set of calibration values to be used to correct the measured displacement notwithstanding the change in separation between calibration mode and writing mode. Processor 120 corrects the measured displacement by combining the offset calibration value with the measured displacement. Combining the offset calibration value with the measured displacement generates a displacement value that accurately quantifies the offset of stage 50.

Figure 3:
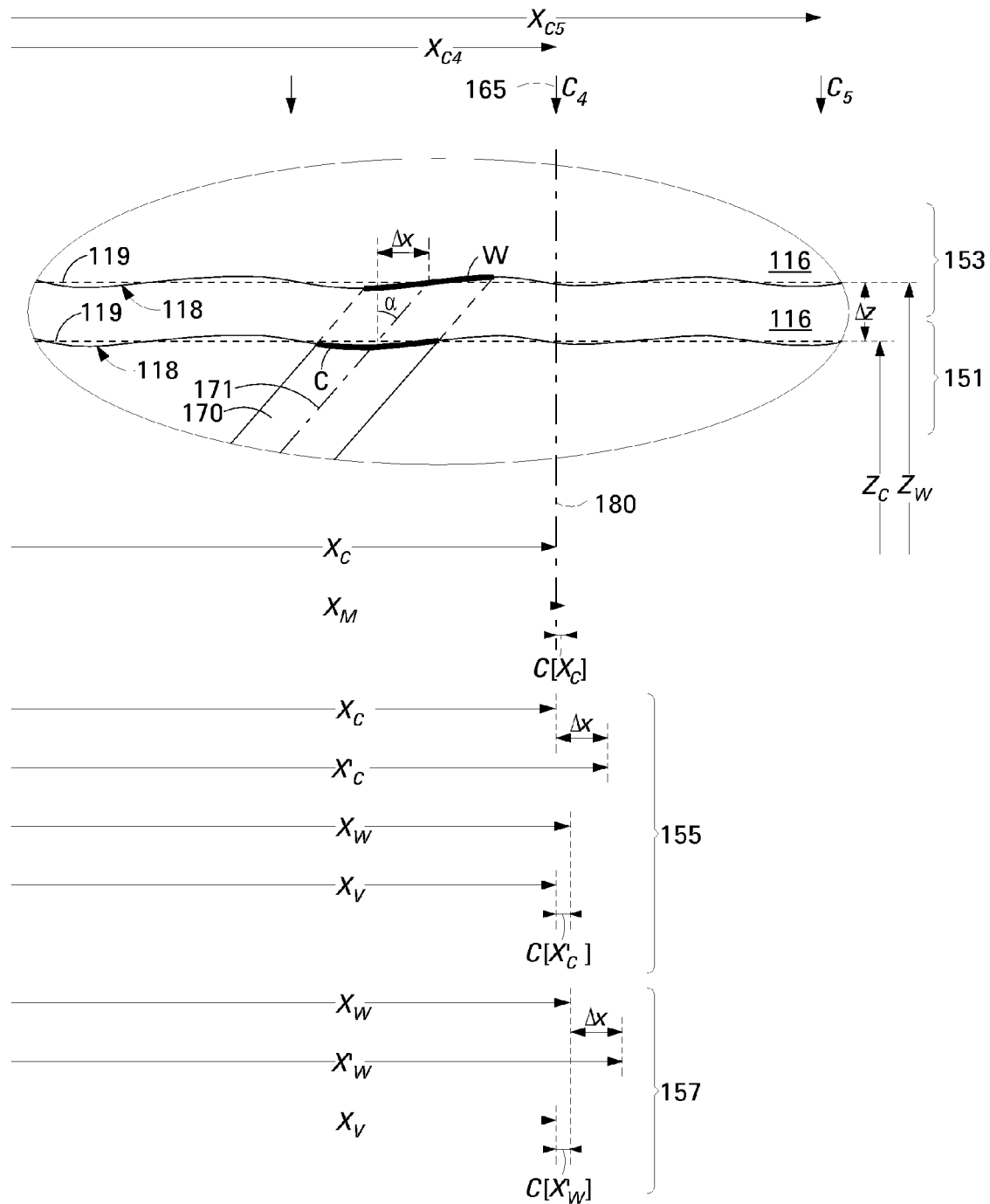
FIG. 3 is an enlarged side view showing a small region of the diffractive surface of the diffraction grating of the metrology system shown in FIG. 1 at two different separations between the stage and the interferometer head.

FIG. 3 is an enlarged side view showing a small region of the diffractive surface 118 of diffraction grating 116 at two different separations between stage 50 and interferometer head 112. The region shown in FIG. 3 is that indicated at 3 in FIG. 1 and is the region in which measurement beam 170 is incident. The principal ray of measurement beam 170 is shown at 171. Diffraction grating 116 additionally has a nominal plane 119 from which diffractive surface 118 deviates in the z-direction. The deviation of diffractive surface 118 from nominal plane 119 represents a macroscopic deviation of the diffractive surface, and not the grooves that constitute diffraction grating 116.

FIG. 3 additionally shows the positions of exemplary ones of the measurement marks on the calibration wafer mounted on stage 50 in the calibration mode of metrology system 100. The positions of the measurement marks are represented by arrows. The arrow representing the position of an exemplary one of the measurement marks is labelled with reference numeral 165. The measurement mark in that position will be referred to as measurement mark 165.

FIG. 3 also shows an x-direction reference plane 180 of metrology system 100. From now on, x-direction reference plane 180 will be referred to as x-reference plane 180. X-reference plane 180 is oriented parallel to the y-z plane, and is located at a arbitrary location in the x-direction near interferometer head 112. Displacements of stage 50 in the x-direction are measured relative to x-reference plane 180. Optical system 40 is mounted on armature 32 accurately aligned with x-reference plane 180 or at a location having an accurately-known positional relationship thereto.

In FIG. 3, the separation shown at 151 is that to which stage 50 is set in the calibration mode of metrology system 100 and the separation shown at 153 is an exemplary separation in the writing mode of metrology system 100. At separation 151, stage 50 on which grating 116 is mounted has been positioned such that nominal plane 119 is at the single separation $Z_C$ from interferometer head 112 (FIG. 1) at which the above-described calibration process is performed. At separation 153, stage 50 on which grating 116 is mounted has been positioned such that nominal plane 119 is at an exemplary separation $Z_W$ from interferometer head 112. Separation $Z_W$ differs by a separation change of $\Delta z$ from separation $Z_C$ at which metrology system 100 was calibrated as a result of stage 50 being moved in the z-direction to focus the pattern image on the major surface of the production wafer, as described above with reference to FIG. 1. In the example shown in FIG. 3, to simplify the following description, stage 50 has not been moved in the x-direction between the writing mode shown at 153 and the calibration mode shown at 151. Stage 50 has only moved in the z-direction.

In the calibration mode of metrology system 100, stage 50 has been moved to align the reference mark on the calibration wafer with optical system 40, and then has been moved to align measurement mark 165 with x-reference plane 180 and, hence with optical system 40, as described above. The separation of stage 50 in the z-direction is that shown at 151. The known displacement of measurement mark 165 from the reference mark on the calibration wafer is $X_C$. Thus, the displacement of stage 50 differs by $X_C$ from its displacement when the reference mark of the calibration wafer was aligned with x-reference plane 180. With measurement mark 165 aligned with x-reference plane 180, metrology system 100 measures the displacement $X_M$ of measurement mark 165 from the reference mark as described above. Measured displacement $X_M$ should be identical to known displacement $X_C$, but due to errors in grating 116, and, specifically, due to errors in the region of the grating on which measurement beam 170 is incident, the measured displacement differs from the known displacement.

When measurement mark 165 is aligned with x-reference plane 180 in calibration mode, measurement beam 170 is incident on diffractive surface 118 in a region of incidence C. Measured displacement $X_M$ therefore depends on the properties of diffractive surface 118 in region of incidence C. Since calibration value $C[X_C]$ pertaining to the known displacement $X_C$ of measurement mark 165 exemplified in FIG. 3 is obtained by differencing known displacement $X_C$ and measured displacement $X_M$, calibration value $C[X_C]$ pertaining to known displacement $X_C$ also depends on the properties of region of incidence C of diffractive surface 118. In this disclosure, to improve readability, an argument indicating to what a variable pertains is set forth in brackets to avoid using two levels of suffices. For example, calibration value $C[X_C]$ is a calibration value C that pertains to known displacement $X_C$. The expression $C[X_C]$ does not represent the product of C and $X_C$.

In the writing mode of metrology system 100, the separation of stage 50, and, hence, diffractive surface 118, in the z-direction is that shown at 153, which is different from that in calibration mode shown at 151. Due to the non-zero angle of incidence of measurement beam 170 on diffractive surface 118, the movement of stage 50 in the z-direction causes measurement beam 170 now to be incident on diffractive surface 118 in a region of incidence W. Region of incidence W is offset in the x-direction from region of incidence C where the measurement beam was incident during calibration even though stage 50 has not moved in the x-direction between calibration mode and writing mode. In region of incidence W, such properties of diffractive surface 118 as z-direction deviation from nominal plane 119, line pitch, line straightness, etc. differ from those in region of incidence C.

Thus, when metrology system 100 in writing mode measures the displacement of stage 50 after the stage has moved from the separation in the z-direction at which metrology system 100 was calibrated, as shown in FIG. 3, the resulting measured displacement $X_W$ differs from the displacement $X_M$ measured in calibration mode because measurement beam 170 is incident in region of incidence W of diffractive surface 118. Region of incidence W is offset in the x-direction from region of incidence C by an offset $\Delta x$ that depends on the separation change $\Delta z$ between calibration mode and writing mode. Consequently, correcting measured displacement $X_W$ using the calibration value $C[X_C]$ pertaining to region of incidence C of grating 116 will not produce a displacement value having the required accuracy. Instead, the calibration value needed to correct measured displacement $X_W$ is one pertaining to region of incidence W, the region of the diffractive surface 118 of grating 116 on which measurement beam 170 is incident in writing mode. It is the dependence of the displacement in the x-direction of the region of incidence on the separation between the diffractive surface and the interferometer head that requires that the above-described conventional metrology system be calibrated at multiple separations in the z-direction so that a calibration value that pertains to both to a known separation of the stage in the z-direction and a known displacement of the stage in the x-direction can be used to correct the measured displacement of stage 50 in writing mode.

Embodiments of a metrology system and metrology method in accordance with the invention use an offset calibration value derived from a single set of original calibration values to correct the measured displacement of stage 50 in writing mode. The same single set of original calibration values is used regardless of the separation between the stage and the interferometer head. Since a single set of calibration values can be used, the time needed to calibrate metrology system 100 is substantially less than that of a conventional metrology system, and the time available for photolithography apparatus 30 incorporating metrology system 100 to process writing wafers is increased.

Specifically, in the example shown in FIG. 3, as a result of stage 50 moving in the z-direction between calibration mode and writing mode, region of incidence W in which measurement beam 170 is incident in writing mode is offset in the x-direction from region of incidence C in which measurement beam 170 is incident in calibration mode. The original calibration value $C[X_C]$ pertaining to a known displacement equal to the measured displacement $X_W$ of stage 50 measured by metrology system 100 in writing mode cannot properly correct measured displacement $X_W$. Instead, an offset calibration value pertaining to an offset displacement is used. Theoretically, an offset correction value $C[X'_C]$ pertaining to an offset displacement $X'_C$ would be used to correct measured displacement $X_W$ in writing mode, as shown at 155. Offset displacement $X'_C$ is offset in the x-direction from known displacement $X_C$ by an offset of $\Delta x$. Offset $\Delta x$ is equal to the displacement in the x-direction of region of incidence W from region of incidence C. Measured displacement $X_W$ is corrected using offset correction value $C[X'_C]$ to obtain a displacement value $X'_V$ that accurately quantifies the displacement of stage 50.

In practice, since only measured displacement $X_W$ is known in writing mode, an offset correction value $C[X'_W]$ pertaining to an offset displacement $X'_W$ is used to correct measured displacement $X_W$, as shown at 157. Offset displacement $X'_W$ is offset in the x-direction from measured displacement $X_W$ by an offset of $\Delta x$. Measured displacement $X_W$ is corrected using offset correction value $C[X'_W]$ to obtain a displacement value $X_V$ that, although different from displacement value $X'_V$, quantifies the displacement of stage 50 with an accuracy sufficient for the above-described semiconductor photolithography process, even when used in a 45 nm process. A computation process more complex than that described below can be used in applications that demand the additional accuracy obtained by correcting measured displacement $X_W$ using offset correction value $C[X'_C]$ pertaining to an offset displacement $X'_C$.

The separation $Z_W$ in the z-direction of stage 50 from interferometer head 112 in writing mode differs from the separation $Z_C$ of stage 50 in calibration mode by a separation difference of $\Delta z$, which is the separation change of stage 50. The angle of incidence of measurement beam 170 on nominal plane 119 is $\alpha$. The displacement in the x-direction of region of incidence W differs from that of region of incidence C by offset $\Delta x$. Since the angle of incidence does not change as stage 50 moves in the z-direction, offset $\Delta x$ can be calculated from separation change $\Delta z$ using the equation $\Delta x = \Delta z \tan \alpha$. Measured displacement $X_W$ of stage 50 measured by metrology system 100 in writing mode then is corrected using an offset calibration value pertaining to offset displacement $X'_W$ that is offset in the x-direction from the measured displacement $X_W$ of stage 50 by offset $\Delta x = \Delta z \tan \alpha$.

FIG. 2B is a flow chart showing an example of the processing performed by processor 120 in the writing mode of metrology system 100. Referring additionally to FIG. 1, as stage 50 moves in the x-direction to align the location of one of the semiconductor devices on the production wafer with the pattern image projected by the pattern projector and additionally moves in the z-direction to focus the pattern image on the surface of the production wafer, in block 131, processor 120 counts the fringes represented by the electrical signal received from interferometer assembly 113 to generate a measured fringe count $N_W$. In block 133, processor 120 uses the following equation to calculate the measured displacement $X_W$ in the x-direction of fringe 50 from measured fringe count $N_W$, separation change $\Delta z$ represented by separation change signal SC received from separation change detector 110, angle of incidence $\alpha$ and pitch p:

$$X_W = p N_W - \Delta z \cot \alpha.$$

In block 135, processor 120 uses the following equation to calculate x-direction offset $\Delta x$ from the angle of incidence $\alpha$ of measurement beam 170 and separation change $\Delta z$ represented by separation change signal SC:

$$\Delta x = \Delta z \tan \alpha.$$

In block 137, processor 120 sums offset Δx and measured displacement $X_W$ to obtain offset displacement $X'_W$.

Processor 120 then derives an offset calibration value $C[X'_W]$ from at least one of the original calibration values, and corrects measured displacement $X_W$ by combining offset calibration value $C[X'_W]$ with measured displacement $X_W$. Combining offset calibration value $C[X'_W]$ with measured displacement $X_W$ generates a displacement value $X_V$ that accurately quantifies the displacement of stage 50. Offset calibration value $C[X'_W]$ pertains to offset displacement $X'_W$ offset from measured displacement $X_W$ in the x-direction by offset Δx. The one or more of the original calibration values from which offset calibration value $C[X'_W]$ is derived are those of the original calibration values that pertain to respective known displacements closest to offset displacement $X'_W$.

FIG. 2B shows an example of the processing performed by processor 120 to correct measured displacement $X_W$ using offset calibration value $C[X'_W]$ pertaining to offset displacement $X'_W$ calculated in block 137. In block 139, processor 120 performs a test to determine whether offset displacement $X'_W$ is within a defined tolerance of one of the known displacements to which a respective original calibration value is linked in calibration value memory 122. Such known displacement can be regarded as being nominally equal to the measured displacement. A YES result in block 139 causes execution to advance to block 141, where processor 120 adopts the original calibration value pertaining to the known displacement nominally equal to offset displacement $X'_W$ as offset calibration value $C[X'_W]$ pertaining to offset displacement $X'_W$. Processor 120 derives offset calibration value $C[X'_W]$ by reading from calibration memory 122 the calibration value linked to the known displacement nominally equal to offset displacement $X'_W$. Execution then advances to block 145, which will be described below. A NO result in block 139 causes execution to advance to block 143.

In block 143, processor 120 determines offset calibration value $C[X'_W]$ by interpolation. In an example, processor 120 determines offset calibration value $C[X'_W]$ by linear interpolation using original calibration values pertaining to two known displacements bracketing offset displacement $X'_W$. Known displacements bracketing offset displacement $X'_W$ are the known displacements closest to the offset displacement, one greater than, the other less than the offset displacement. Referring to FIG. 3, offset displacement $X'_W$ is part-way between a known displacement $X_{C4}$ and a known displacement $X_{C5}$ of two adjacent measurement marks to which calibration values $C_4$ and $C_5$ respectively pertain. Known displacements $X_{C4}$ and $X_{C5}$ are the known displacements closest to offset displacement $X'_W$. Known displacement $X_{C5}$ is greater than and known displacement $X_{C4}$ is less than offset displacement $X'_W$.

In block 143, processor 120 reads from calibration value memory 122 the calibration values linked to known displacements $X_{C4}$ and $X_{C5}$ bracketing offset displacement $X'_W$. Processor 120 then uses the following equation to calculate offset calibration value $C[X'_W]$ pertaining to offset displacement $X'_W$ by linear interpolation:

$$C[X'_W] = C_4 + \frac{(X'_W - X_{C4})}{(X_{C5} - X_{C4})}(C_5 - C_4).$$

In another example, processor 120 reads from calibration value memory 122 the calibration values linked to more than two known displacements bracketing offset displacement $X'_W$ and calculates offset calibration value $C[X'_W]$ using linear interpolation or another interpolation scheme such as polynomial interpolation or spline interpolation. Execution then advances to block 145.

In block 145, processor 120 combines offset calibration value $C[X'_W]$ obtained in block 141 or 143 with measured fringe count $N_W$ obtained in block 131 to obtain a corrected fringe count $N'_W$. In an example, processor 120 adds offset calibration value $C[X'_W]$, which is expressed as a fringe count difference, to measured fringe count $N_W$.

In block 147, processor 120 uses the following equation to calculate displacement value $X_V$ from corrected fringe count $N'_W$ obtained in block 145, separation change Δz, grating pitch p and angle of incidence α:

$$X_V = pN'_W - \Delta z \cot \alpha$$

Displacement value $X_V$ quantifies the displacement of stage 50 more accurately than measured displacement $X_W$. Processor 120 outputs displacement value $X_V$ to photolithography apparatus 30, and returns to block 131 to generate another fringe count from which it will generate the next value of displacement value $X_V$. Alternatively, processor 120 may count fringes concurrently with performing the rest of the processing.

In metrology system 100, some embodiments of separation change detector 110 measure separation change Δz as a change in the separation between stage 50 and interferometer head 112. Although separation change Δz is referred to above as a change in the separation in the z-direction between stage 50 and interferometer head 112, the separation between interferometer head 112 and the diffractive surface 118 of diffraction grating 116 is what actually controls the fringe count determined by processor 120 in block 131 as stage 50 moves from its start position to a current position. Although movement of stage 50 in the z-direction in response to the focusing servo of photolithography apparatus 30 is the main contributor to the changes in separation between diffractive surface 118 and interferometer head 112, deviations in the z-direction of diffractive surface 118 from the nominal plane 119 of grating 116 also contribute to such changes. Such contributions to the separation change are not quantified by an embodiment of separation change detector 110 that only measures changes in the separation of stage 50.

Figure 4:
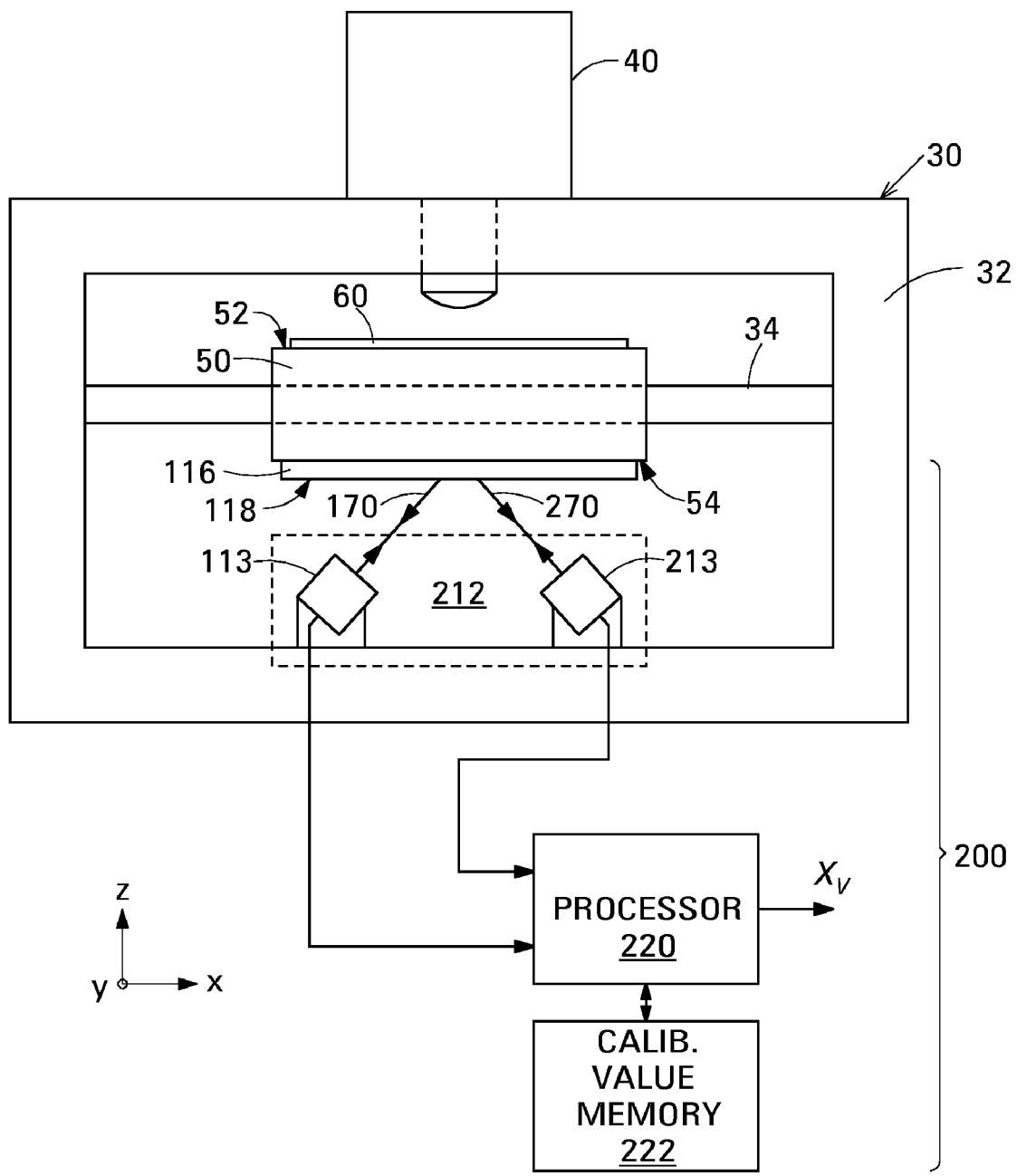
FIG. 4 is a schematic diagram showing another example of a metrology system in accordance with an embodiment of the invention.

FIG. 4 is a schematic diagram showing an example of a metrology system 200 in accordance with another embodiment of the invention applied to photolithography apparatus 30 described above with reference to FIG. 1. In metrology system 200, interferometer head 212 comprises two interferometer assemblies. Interferometer head 212 and processing performed by a processor 220 constitute an embodiment of separation change detector 110 shown in FIG. 1. Such embodiment of separation change detector 110 measures the separation in the z-direction between diffractive surface 118 and interferometer head 212, and allows metrology system 200 to take into account deviations in the z-direction of diffractive surface 118 from nominal plane 119. Photolithography apparatus 30 is described above with reference to FIG. 1 and will not be described again in detail. Elements of metrology system 200 that correspond to elements of metrology system 100 described above with reference to FIG. 1 are indicated using the same reference numerals and will not be described again in detail.

Metrology system 200 is composed of an interferometer head 212, a processor 220, calibration value memory 222 and diffraction grating 116. Interferometer head 212 comprises interferometer assembly 113 and an interferometer assembly 213. Interferometer assembly 213 is similar to in structure and function to interferometer assembly 113 but differs in the direction in which it directs a measurement beam towards grating 116. Interferometer head 212 directs measurement beam 170 towards grating 116 and additionally directs measurement beam 270 towards a location on grating 116 close to that at which measurement beam 170 is incident. Specifically, interferometer assembly 113 directs measurement beam 170 towards grating 116 such that measurement beam 170 is incident on grating 116 at a non-zero angle of incidence, and interferometer assembly 213 directs measurement beam 270 towards grating 116 such that measurement beam 270 is incident on grating 116 at a non-zero angle of incidence. In the example shown, to simplify the following description, interferometer assembly 213 is a single-pass interferometer head that directs measurement beam 270 towards grating 116 only once. In other examples, interferometer assembly 213 is a double-pass interferometer head that directs measurement beam 270 towards diffraction grating 116 twice. In the example shown, interferometer assembly 113, diffraction grating 116 and processing performed by processor 220 constitute a first Littrow interferometer, and interferometer assembly 213, diffraction grating 116 and other processing performed by processor 220 constitute a second Littrow interferometer. Alternatively, interferometer head 212 is configured as described in above-mentioned U.S. patent application Ser. No. 11/686,855 or in above-mentioned U.S. patent application Ser. No. 12/172,810.

Interferometer assembly 213 directs measurement beam 270 towards diffraction grating 116 such that measurement beam 270 is incident on grating 116 at an angle of incidence equal to and opposite that of measurement beam 170. Thus, both measurement beams 170, 270 are incident on grating 116 at an angle of incidence equal to the Littrow angle of diffraction grating 116. Diffraction grating 116 diffracts measurement beams 170, 270 back towards interferometer head 212 along respective reciprocal paths.

Within interferometer assembly 213, measurement beam 270 and a reference beam (not shown) are superposed on a photodetector that generates an electrical signal. The electrical signal represents the intensity of the light beams incident on the photodetector. Due to interference between measurement beam 270 and the reference beam, the amplitude of the electrical signal varies approximately sinusoidally as stage 50 moves. The electrical signal is output to processor 220. In processor 220, the electrical signal is converted to a digital signal. Processor 220 applies processing similar to that described above with reference to FIG. 1 to count the number of cycles of the electrical signal output by interferometer assembly 213 as stage 50 moves from its start position to a current position to provide a respective fringe count $N_B$ for interferometer assembly 213. In addition, processor 220 processes the electrical signal output by interferometer assembly 113 in a manner similar to that described above to generate a respective fringe count $N_A$ for interferometer assembly 113. Each fringe count has an integer portion and a fractional portion, also as described above.

As stage 50 moves from its start position to a current position, processor 220 uses the following equations to calculate a displacement of stage 50 from fringe counts $N_A$ and $N_B$. The displacement has a component x in the x-direction and component z in the z-direction. The z-component of the displacement is referred to herein as the separation change.

$$x = \frac{p}{4}(N_B - N_A) = S_x(N_B - N_A),$$

and $$z = \frac{p\tan\alpha}{4}(N_B + N_A) = S_z(N_B + N_A),$$

where an x-direction sensitivity $S_x$ is equal to p/4 and a z-direction sensitivity $S_z$ is equal to (p tan α)/4. In an example in which the wavelength of measurement beams 170, 270 is 1550 nm, angle of incidence α of 49.073° and the pitch of grating 116 is 1.0417 μm, the sensitivities are $S_x$=260.4 nm/fringe difference and $S_z$=290.0 nm/fringe sum.

Metrology system 200 is calibrated using a calibration process similar to that described above with reference to FIG. 1. Again, calibrating metrology system 200 generates only a single set of original calibration values pertaining to no more than one separation in the z-direction between stage 50 and interferometer head 112. Each original calibration value is a two-dimensional value.

Calibrating metrology system 200 generates a table of original calibration values. The table of original calibration values is typically stored in calibration value memory 222. Calibration value memory 222 is typically a non-volatile memory. Each entry in the table is composed of a displacement in the x-direction and a respective two-dimensional original calibration value. The displacement can be the known displacement of stage 50 or the measured displacement of stage 50 measured in the calibration process. The known displacement and the measured displacement are interchangeable since one can be derived from the other using the respective original calibration value. In one example, the original calibration value is composed of an x-direction displacement difference and a z-direction separation difference. In another example, described in greater detail below, the original calibration value is composed of a fringe count difference for interferometer assembly 113 and a fringe count difference for interferometer assembly 213.

In a three-dimensional version of metrology system 200 in which two orthogonal sub-systems, each similar to metrology system 200, measure the displacement of stage 50 in the x-direction and in the y-direction, respectively, each sub-system has a respective calibration value memory in which is stored a table of original calibration values in which each entry is composed of a displacement in the x-direction, a displacement in the y-direction, and a respective two-dimensional original calibration value. The displacement can be a known displacement or a measured displacement, as described above. In the calibration value table of the sub-system that measures displacement in the x-direction, each original calibration value is a two-dimensional value composed of an x-direction displacement difference and a z-direction separation difference, or respective fringe count differences for interferometer assemblies 113, 213 offset from one another in the x-direction, as described above. In the calibration value table of the sub-system that measures displacement in the y-direction, each original calibration value is a two-dimensional value composed of a y-direction displacement difference and a z-direction separation difference, or respective fringe count differences for the two additional interferometer assemblies offset from one another in the y-direction.

Alternatively, a single three-dimensional metrology system that measures the displacement of the stage in the x-direction and in the y-direction and additionally measures the separation change of the stage the z-direction has a single calibration value memory in which is stored a table of original calibration values. Each entry in the table is composed of a displacement in the x-direction, a displacement in the y-direction, and a three-dimensional original calibration value having an x-direction component, a y-direction component and a z-direction component. The displacements can be respective known displacements or respective measured displacements, as described above. Each component of the original calibration value is a difference between the measured displacement and the known displacement in the respective direction. In an example, the displacements can be a respective fringe count different for each of four interferometer assemblies.

After metrology system 200 has been calibrated, a production wafer (not shown) is mounted on the first surface 52 of stage 50 and optical system 40 is set to its projection mode. Stage 50 is first moved in the x-direction and, if necessary, in the z-direction, to its start position. Stage 50 is next moved in the x-direction to align one of the semiconductor devices being defined in and on the production wafer with optical system 40. Stage 50 is additionally moved in the z-direction to focus the pattern image on the surface of the production wafer. As stage 50 moves, metrology system 200 generates displacement values that accurately quantify the displacement of stage 50. The displacement values are input to a positioning servo (not shown) that controls the movement of the stage.

Specifically, processor 220 counts the interference fringes represented by the electrical signals output by interferometer assemblies 113, 213 to obtain respective fringe counts, and calculates a measured displacement of stage 50 from the fringe counts. The measured displacement is a two-dimensional (x, z) value. The measured displacement is highly precise but, due to imperfections in diffraction grating 116, it is of insufficient accuracy, and therefore must be corrected using an offset calibration value pertaining to two offset displacements. The offset displacements are offset in opposite directions from the measured displacement by an offset that depends on the separation change of stage 50. Correcting the measured displacement using the offset calibration value generates a displacement value that quantifies the displacement of the stage with the required accuracy.

Processor 220 calculates a separation change by differencing the second separation (indicated by the z-component of the measured displacement) and the first separation. However, in examples in which the first separation corresponds to the start position of stage 50, the z-component of the measured displacement provides the separation change directly. Processor 220 also calculates the offset from the separation change, calculates the two offset displacements from the offset and the measured displacement, and derives the offset calibration value pertaining to the offset displacements from two or more of the original calibration values. Typically, the original calibration values are those pertaining to known displacements bracketing each of the offset displacements. Processor 220 corrects the measured displacement using the offset calibration value by combining the measured displacement and the offset calibration value to generate a displacement value. Processor 220 then outputs the displacement value to photolithography apparatus 30 as described above.

Figure 5:
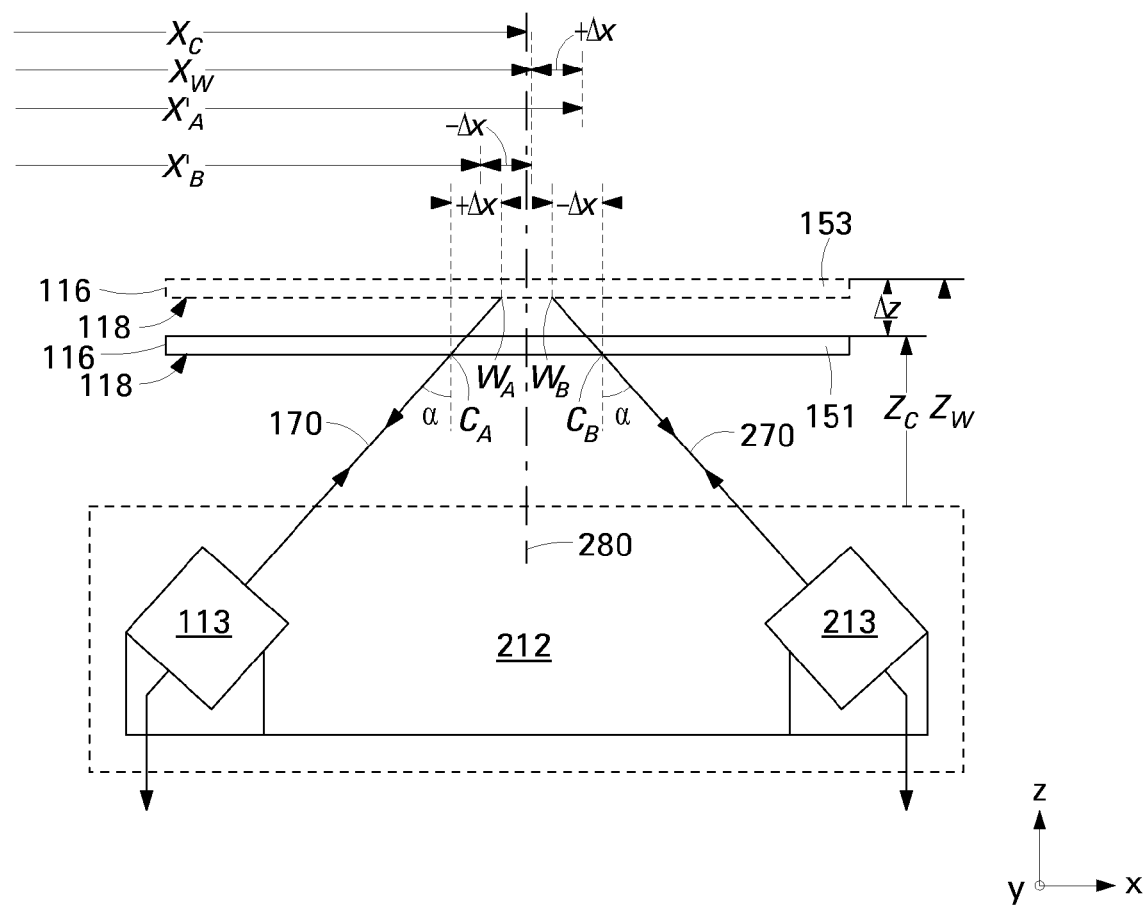
FIG. 5 is a schematic drawing showing an example of respective separations of the diffraction grating in the calibration mode and in the writing mode of the metrology system shown in FIG. 4.

FIG. 5 is a schematic drawing showing an example of respective separations of diffraction grating 116 constituting part of metrology system 200 in the calibration mode and writing mode of metrology system 200. FIG. 5 will be described below with additional reference to FIG. 4. FIG. 5 shows diffraction grating 116, measurement beam 170 directed by interferometer assembly 113 towards grating 116, and measurement beam 270 directed by interferometer assembly 213 towards grating 116. Only the principal rays of measurement beams 170, 270 are shown to simplify the drawing. In FIG. 5, solid lines and reference numeral 151 indicate grating 116 in the calibration mode of metrology system 200 in calibration mode. Broken lines and reference numeral 153 indicate grating 116 in the writing mode of metrology system 200.

FIG. 5 also shows an x-direction reference plane 280 of metrology system 200. From now on, x-direction reference plane 280 will be referred to as x-reference plane 280. X-reference plane 280 is oriented parallel to the y-z plane, and is located approximately mid-way in the x-direction between interferometer assemblies 113, 213. Displacements of stage 50 are measured relative to x-reference plane 280. Optical system 40 is mounted on armature 32 accurately aligned with x-reference plane 280 or at a location having an accurately know positional relationship thereto.

In the calibration mode of metrology system 200, optical system 40 is set to its imaging mode, and stage 50 is moved in the x-direction to precisely align the reference mark on calibration wafer 60 with optical system 40. Stage 50 is additionally moved in the z-direction to a first separation from interferometer head 212. This position of stage 50 in the x- and z-directions is the start position of stage 50. Stage 50 is maintained at the first separation from interferometer head 212 throughout the calibration process. Stage 50 is next moved in the x-direction to precisely align one of the measurement marks on calibration wafer 60 with optical system 40. The measurement mark has a known displacement from the reference mark. The known displacement is a two-dimensional value having an x-direction component $X_C$ and a z-direction component $Z_C$. When the measurement mark is aligned with optical system 40, measurement beam 170 is incident on grating 116 in a region of incidence $C_A$ and measurement beam 270 is incident on grating 116 in a region of incidence $C_B$.

FIG. 6A is a flow chart showing an example of the processing performed by processor 220 in the calibration mode of metrology system 200. Referring additionally to FIG. 5, at the start of the calibration process, metrology system 200 is initialized by moving stage 50 in the x-direction to align the reference mark on calibration wafer 60 with optical system 40. Stage 50 is additionally moved in the z-direction to the separation at which the calibration process will be performed. In block 221, with stage 50 positioned as just described, the fringe counts generated by processor 220 are initialized. For example, the fringe counts are set to zero. Stage 50 is then moved in the x-direction to align one of the measurement marks on calibration wafer 60 with optical system 40. As stage 50 moves, processor 220 counts the fringes represented by the electrical signal received from interferometer assembly 113 and additionally counts the fringes represented by the electrical signal received from interferometer assembly 213. In bock 223, when the measurement mark is precisely aligned with optical system 40, processor 220 generates a measured fringe count $N_A$ indicating the number of fringes represented by the electrical signal received from interferometer assembly 113 and generates a measured fringe count $N_B$ indicating the number of fringes represented by the electrical signal received from interferometer assembly 213.

In block 225, processor 220 uses the following equations to calculate a measured displacement of the measurement mark from the reference mark from fringe counts $N_A$, $N_B$. The measured displacement is a two-dimensional value having an x-direction component $X_M$ and a z-direction component $Z_M$.

$$X_M = \frac{p}{4}(N_B - N_A),$$

and $$Z_M = \frac{p \tan\alpha}{4}(N_B + N_A).$$

The measured displacement of the measurement mark from the reference mark is also a measure of the displacement of stage 50 since calibration wafer 60 does not move relative to stage 50 during the calibration process.

In block 227, processor 220 calculates a calibration value $C[X_C]$ pertaining to the x-direction component of the known displacement of stage 50 when the measurement mark is aligned with optical system 40. The known displacement is a two-dimensional value having an x-direction component $X_C$ and a z-direction component $Z_C$. To simplify the following description, the x-direction component of the known displacement will be referred to as known displacement $X_C$. In the example shown, calibration value $C[X_C]$ pertaining to known displacement $X_C$ is a two-dimensional value composed of a first calibration value component and a second calibration value component. In the example described below, the first calibration value component and the second calibration value component of calibration value $C[X_C]$ are a fringe count difference $E_A[X_C]$ pertaining to interferometer assembly 113 and a fringe count difference $E_B[X_C]$ pertaining to interferometer assembly 213, respectively. As noted above, known displacement $X_C$ is set forth in brackets after fringe count differences $E_A$, $E_B$ to indicate that the fringe count difference pertain to known displacement $X_C$.

Processor 220 uses the following equations to calculate fringe count differences $E_A[X_C]$ and $E_B[X_C]$ from the measured displacement having components ($X_M$, $Z_M$) measured by metrology system 200 and the known displacement having components ($X_C$, $Z_C$) of the measurement mark from the reference mark:

$$E_A[X_C] = \frac{2}{p}\{+(X_C - X_M) + (Z_C - Z_M)\cot\alpha\}$$

$$E_B[X_C] = \frac{2}{p}\{-(X_C - X_M) + (Z_C - Z_M)\cot\alpha\}.$$

In block 229, processor 220 stores calibration value $C[X_C]$ in calibration value memory 222 linked to the known displacement $X_C$ in the x-direction of the measurement mark from the reference mark on calibration wafer 60. Alternatively, calibration value $C[X_C]$ may be stored linked to the measured displacement $X_M$ measured in the calibration mode of the measurement mark from the reference mark. Since the difference between known displacement $X_C$ and measured displacement $X_M$ is extremely small, accuracy sufficient for the purposes described herein is obtained regardless whether calibration value $C[X_C]$ is linked to measured displacement $X_M$ or known displacement $X_C$.

Processor 220 performs the processing just described for each of the measurement marks aligned with optical system 40 to generate the remainder of the single set of calibration values for metrology system 200. The processing just described may be performed as each measurement mark is aligned with optical system 40. Alternatively, processor 220 performs block 223 as each measurement mark is aligned with optical system 40 and stores the resulting pair of measured fringe counts. After all or some of the measured fringe counts have been stored, processor 220 performs blocks 225, 227 and 229 for each pair of stored measured fringe counts. For each of the measurement marks, processor 220 stores the respective calibration value $C[X_C]$ having fringe count differences $E_A[X_C]$ and $E_B[X_C]$ as its first and second calibration value components, respectively, in calibration value memory 222 linked to the respective known displacement $X_C$ or measured displacement $X_M$ in the x-direction of the respective measurement mark from the reference mark.

Referring again to FIG. 5, with metrology system 200 in calibration mode and grating 116 at the separation indicated at 151, fringe count difference $E_A[X_C]$ constituting the first calibration value component of calibration value $C[X_C]$ depends on the properties of the diffractive surface 118 of diffraction grating in a region of incidence $C_A$ where measurement beam 170 is incident. Similarly, fringe count difference $E_B[X_C]$ constituting the second calibration value component of calibration value $C[X_C]$ depends on the properties of the diffractive surface 118 of diffraction grating 116 in a region of incidence $C_B$ where measurement beam 270 is incident. Regions of incidence $C_A$ and $C_B$ are displaced from x-reference plane 280 in the negative x-direction and the positive x-direction, respectively, by a displacement that depends on the first separation, i.e., the separation $Z_C$ between diffractive surface 118 and interferometer head 213 at which metrology system 200 is calibrated.

FIG. 5 also shows at 153 metrology system 200 in writing mode in which it measures the displacement of stage 50. A production wafer (not shown) is mounted on the first major surface 52 of stage 50 and stage 50 is moved to its start position, described above. Optical system 40 is set to its projection mode.

Stage 50 is then moved in the x-direction from its start position towards a target displacement at which one of the semiconductor devices being fabricated in or on the production wafer is accurately aligned with the pattern image projected by the optical system 40. As stage 50 moves, processor 220 generates displacement values that accurately quantify the displacement of stage 50 from its start position and outputs the displacement values to a positioning servo (not shown) that constitutes part of photolithography apparatus 30. The positioning servo compares the displacement value with the target displacement and controls the movement of stage 50 in the x-direction to accurately align the semiconductor device with the pattern image. Additionally, stage 50 moves in the z-direction to focus the pattern image projected by the pattern projector on the surface of the production wafer notwithstanding variations in the thickness and flatness of the wafer. As a result of stage 50 moving in the z-direction, the separation of stage 50 from interferometer head 213 has changed by a separation change of $\Delta z$ when the semiconductor device approaches alignment with the pattern image. As stage 50 moves, interferometer assemblies 113, 213 generate respective electrical signals representing the fringes that cross their respective detectors, and output the electrical signals to processor 220. Processor 220 generates respective fringe counts and processes the fringe counts to measure the displacement $X_W$ of stage 50 from its start position.

To simplify the following description, stage 50 has not been moved in the x-direction between the two operational modes shown in FIG. 5, i.e., only the separation of stage 50 from interferometer head 212 has changed between calibration mode and writing mode. As a result of the separation between stage 50 and interferometer head 212 changing and the non-zero angle of incidence of measurement beams 170, 270, measurement beams 170, 270 are incident on grating 116 in regions of incidence $W_A$ and $W_B$, respectively. Regions of incidence $W_A$ and $W_B$ are offset in the x-direction from regions of incidence $C_A$ and $C_B$, respectively, in which measurement beams 170, 270 were incident during calibration, even though the displacement of stage 50 in the x-direction is unchanged from what it was during calibration. Consequently, in a manner similar to that described above with reference to FIG. 3, a calibration value pertaining to the measured displacement $X_W$ of stage 50 (or a calibration value pertaining to the known displacement $X_C$ of stage 50) would not properly correct measured displacement $X_W$ with the required accuracy.

Instead of using the calibration value pertaining to measured displacement $X_W$ to correct the grating errors in measured displacement $X_W$, an offset calibration value pertaining to two offset displacements is used. In theory, each of the offset displacements is offset in the x-direction from the known displacement by an offset of $\Delta x$. However, similar to what was described above with reference to FIG. 3, a sufficiently accurate correction can be obtained by correcting measured displacement $X_W$ using an offset calibration value pertaining to two offset displacements offset from measured displacement $X_W$ by an offset of $\Delta x$. The offset calibration value is derived from the original calibration values and the two offset displacements are offset from measured displacement $X_W$ by offset $\Delta x$ that depends on separation change $\Delta z$, i.e., the difference in the z-direction between the separation at which metrology system 200 was calibrated and the current separation.

Specifically, measurement beams 170, 270 directed by interferometer head 212 towards grating 116 in metrology system 200 are incident on grating 116 in regions of incidence $W_A$, $W_B$ offset in the x-direction by a separation-dependent offset from regions of incidence $C_A$, $C_B$, respectively, in which measurement beams were incident during calibration. Consequently, offset calibration value $C[X'_A, X'_B]$ used to correct measured displacement $X_W$ is composed of two fringe count differences $E_A[X'_A]$, $E_B[X'_B]$. Fringe count differences $E_A[X'_A]$, $E_B[X'_B]$ constitute respective calibration value components of the original calibration values pertaining to offset displacements $X'_A$, $X'_B$ respectively offset in opposite directions from measured displacement $X_W$ by offset $\Delta x$. During calibration, fringe count difference $E_A[X'_A]$ was derived from the measured fringe count for interferometer assembly 113. Fringe count difference $E_A[X'_A]$ pertains to offset displacement $X'_A$ offset in the +x-direction from measured displacement $X_W$ by offset $\Delta x = \Delta z \tan \alpha$. During calibration, fringe count difference $E_B[X'_B]$ was derived from the fringe count for interferometer assembly 213. Fringe count difference $E_B[X'_B]$ pertains to an offset displacement $X'_B$ offset in the −x-direction from measured displacement $X_W$ by offset $\Delta x = \Delta z \tan \alpha$. Measured displacement $X_W$ is corrected using offset calibration value $C[X'_A, X'_B]$ to obtain displacement value $X_V$ that accurately quantifies the displacement of stage 50.

FIG. 6B is a flow chart showing an example of the processing performed by processor 220 in the writing mode of metrology system 200. As stage 50 moves in the x-direction to align the location of one of the semiconductor devices on the production wafer with the pattern image projected by the pattern projector and additionally moves in the z-direction to focus the pattern image on the surface of the production wafer, in block 231, processor 220 counts the fringes represented by the electrical signals received from interferometer assembly 113 and from interferometer assembly 213 to generate measured fringe count $N_A$ for measurement beam 170 output by interferometer assembly 113 and measured fringe count $N_B$ for measurement beam 270 output by interferometer assembly 213. In block 233, processor 220 uses the following equations to calculate the measured displacement $X_W$ of stage 50 in the x-direction and the separation change $\Delta z$ in the z-direction of stage 50 from measured fringe count $N_A$ and measured fringe count $N_B$:

$$X_W = \frac{p}{4}(N_B - N_A),$$

and $$\Delta z = \frac{p \tan \alpha}{4}(N_B + N_A).$$

In block 235, processor 220 uses the following equation to calculate offset $\Delta x$ in the x-direction from the angle of incidence $\alpha$ of measurement beams 170, 270 and separation change $\Delta z$ calculated in block 233:

$$\Delta x = \Delta z \tan \alpha.$$

In block 237, processor 220 combines offset $\Delta x$ with measured displacement $X_W$ to obtain offset displacement $X'_A$ and offset displacement $X'_B$. Specifically, processor 220 adds offset $\Delta x$ to measured displacement $X_W$ to obtain offset displacement $X'_A$ for measurement beam 170 output by interferometer assembly 113, and subtracts offset $\Delta x$ from measured displacement $X_W$ to obtain offset displacement $X'_B$ for measurement beam 270 output by interferometer assembly 213.

In block 239, processor 220 performs a test to determine whether offset displacement $X'_A$ is within a defined tolerance of one of the known displacements to which a respective original calibration value is linked in calibration value memory 222. Such known displacement can be regarded as being nominally equal to the measured displacement. A YES result in block 239 causes execution to advance to block 241, where processor 220 adopts fringe count difference $E_A[X'_A]$ that constitutes the first calibration value component (abbreviated as CVC in FIG. 6B) of the original calibration value pertaining to the known displacement as the first calibration value component of offset calibration value $C[X'_A, X'_B]$. Processor 220 obtains fringe count difference $E_A[X'_A]$ by reading from calibration value memory 222 the first calibration value component of the original calibration value linked to the known displacement nominally equal to offset displacement $X'_A$. Execution then advances to block 245, described below. A NO result in block 239 causes execution to advance to block 243.

In block 243, processor 220 determines fringe count difference $E_A[X'_A]$ by interpolation. In an example, processor 220 determines fringe count difference $E_A[X'_A]$ by interpolation between or among the fringe count differences that constitute the first calibration value components of the original calibration values pertaining to two or more known displacements bracketing offset displacement $X'_A$. Known displacements bracketing offset displacement $X'_A$ are the known displacements closest to the offset displacement, half of which are greater than, the remainder of which are less than the offset displacement. Processor 220 obtains the fringe count differences by reading from calibration value memory 222 the first calibration value components of the respective original calibration values linked to the known displacements bracketing offset displacement $X'_A$. Processor 220 then uses the fringe count differences, the known displacements of their respective original calibration values, offset displacement $X'_A$ and a suitable interpolation scheme to calculate fringe count difference $E_A[X'_A]$ that constitutes the first calibration value component of offset calibration value $C[X'_A, X'_B]$. Execution then advances to block 245.

In block 245, processor 220 performs a test to determine whether both calibration value components of offset calibration value $C[X'_A, X'_B]$ have been generated. A NO result causes processor 220 to repeat execution of blocks 237, 239, 241, 243 and 245.

In the second performance of block 237, processor 220 combines offset $\Delta x$ with measured displacement $X_W$ to obtain offset displacement $X'_B$. Specifically, processor 220 sums offset $-\Delta x$ and measured displacement $X_W$ to obtain offset displacement $X'_B$ for interferometer assembly 213.

In the second performance of block 239, processor 220 performs a test to determine whether offset displacement $X'_B$ is within a defined tolerance of one of the known displacements to which a respective original calibration value is linked in calibration value memory 222. A YES result in block 239 causes execution to advance to block 241, where processor 220 adopts fringe count difference $E_B[X'_B]$ that constitutes the second calibration value component of the original calibration value pertaining to the known displacement as the second calibration value component of offset calibration value $C[X'_A, X'_B]$. Processor 220 obtains fringe count difference $E_B[X'_B]$ by reading from calibration memory 222 the second calibration value component of the original calibration value linked to the known displacement nominally equal to offset displacement $X'_B$. Execution then advances to block 245, described below. A NO result in block 239 causes execution to advance to block 243.

In the second performance of block 243, processor 220 determines fringe count difference $E_B[X'_B]$ by interpolation. In an example, processor 220 determines fringe count difference $E_B[X'_B]$ by interpolation between or among the fringe count differences that constitute the second calibration value components of the original calibration values pertaining to two or more known displacements bracketing offset displacement $X'_B$, as described above. Processor 220 obtains the fringe count differences by reading from calibration value memory 222 the second calibration value components of the original calibration values linked to the known displacements bracketing offset displacement $X'_B$. Processor 220 then uses the fringe count differences, the known displacements of their respective original calibration values, offset displacement $X'_B$ and a suitable interpolation scheme to calculate fringe count difference $E_B[X'_B]$ that constitutes a second calibration value component of offset calibration value $C[X'_A, X'_B]$. Execution then advances to block 245.

In its second execution, block 245 returns a YES result, and execution advances to block 247.

In block 247, processor 220 uses the following equation to correct measured displacement $X_W$ using fringe count differences $E_A[X'_A]$, $E_B[X'_B]$ that constitute the first and second calibration value components of offset calibration value $C[X'_A, X'_B]$. Correcting measured displacement value $X_W$ generates displacement value $X_V$ that accurately quantifies the current displacement of stage 50.

$$X_V = X_W + \frac{p}{4}\{+E_B[X'_B] - E_A[X'_A]\}.$$

Processor 220 additionally uses the following equation to calculate a separation change value $Z_V$ that more accurately quantifies the separation change than measured separation change $\Delta z$:

$$Z_V = \Delta z + \frac{p\tan\alpha}{4}\{-E_B[X'_B] - E_A[X'_A]\}.$$

where:

$X'_A = X_W + \Delta z \tan\alpha$, and $X'_B = X_W - \Delta z \tan\alpha$.

Processor 220 then outputs at least displacement value $X_V$ to the positioning servo of photolithography apparatus 30.

Figure 7A:
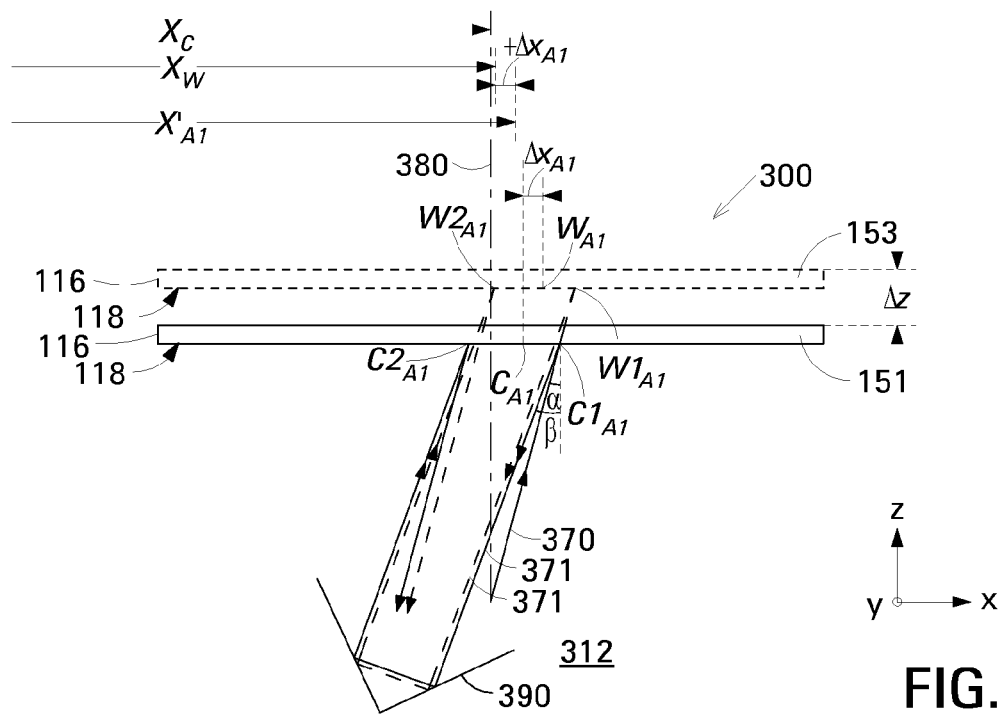
FIGS. 7A and 7B are front elevations and FIG. 7C is a side elevation schematically showing parts of an example of a metrology system in accordance with an embodiment of the invention based on the metrology system disclosed in U.S. patent application Ser. No. 11/686,855.
Figure 7B:
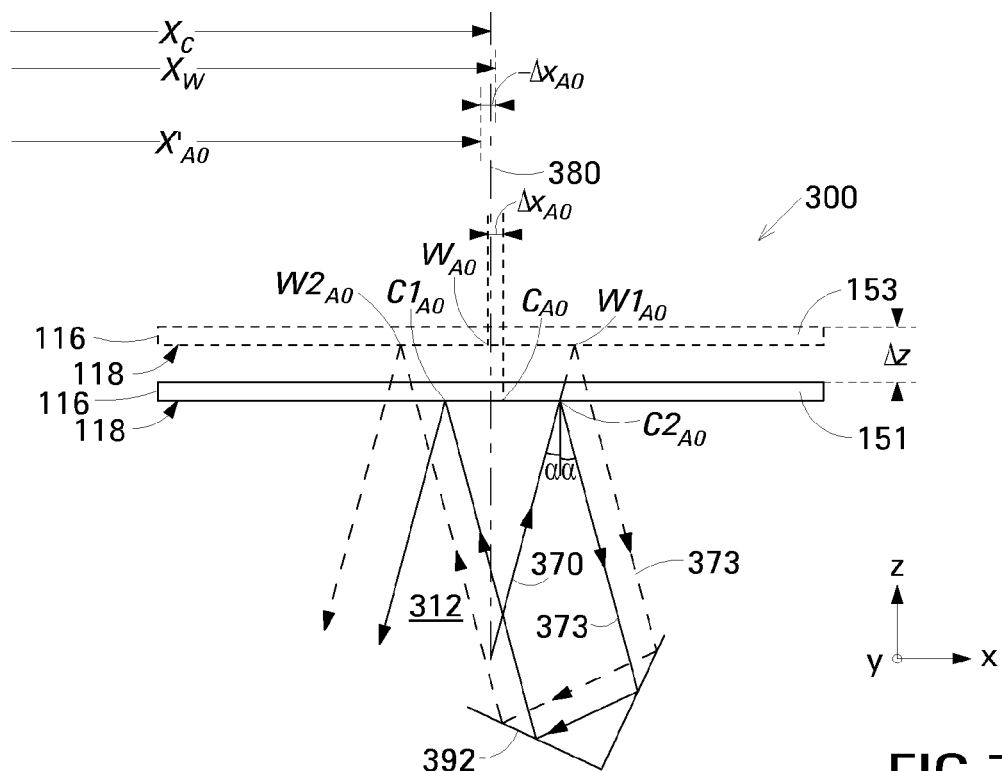
Figure 7C:
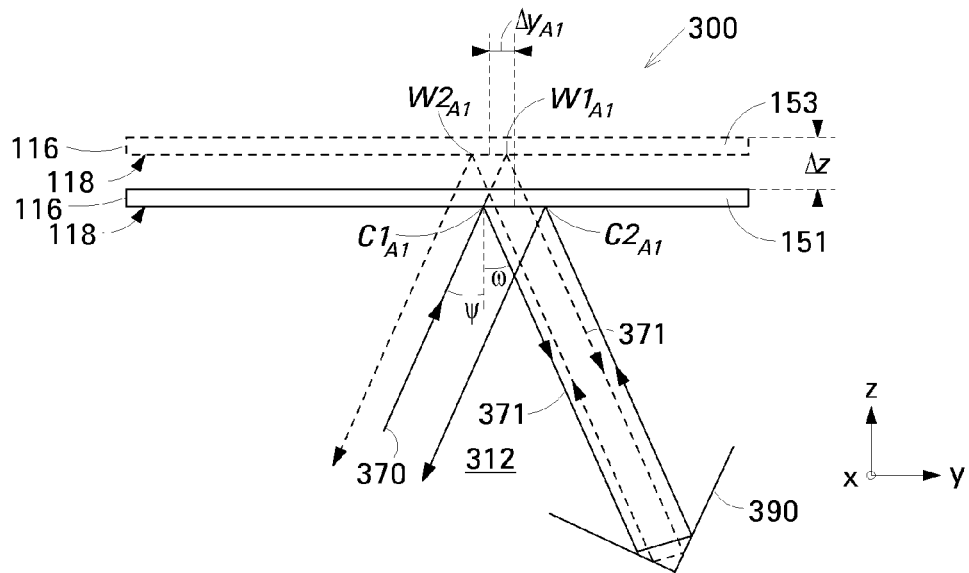

The example of metrology system 200 just described is based on the metrology system disclosed in above-mentioned United States patent application publication no. 2007/0146722. Metrology systems may also be based on the metrology system disclosed in above-mentioned U.S. patent application Ser. No. 11/686,855 or that disclosed in above-mentioned U.S. patent application Ser. No. 12/172,810. FIGS. 7A and 7B are front elevations and FIG. 7C is a side elevation schematically showing parts of an example of a metrology system 300 in accordance with an embodiment of the invention based on the metrology system disclosed in U.S. patent application Ser. No. 11/686,855. An embodiment of metrology system 300 based on the metrology system disclosed in U.S. patent application Ser. No. 12/172,810 would be similar, but would superpose pairs of sub-beams different from those described below to generate respective electrical signals. The following description, while it applies specifically to the metrology system disclosed in U.S. patent application Ser. No. 11/686,855 also applies with minor modifications to the metrology system disclosed in U.S. patent application Ser. No. 12/172,810.

Metrology system 300 comprises diffraction grating 116 and an interferometer head 312. Interferometer head 312 comprises a source of at least one measurement beam, two retroreflectors 390, 392, at least one light detector and various other optical elements as described in the above-mentioned patent application. To simplify the drawings, FIGS. 7A-7C only show measurement grating 116, retroreflectors 390, 392 and the paths of an exemplary measurement beam 370 and sub-beams 371, 373 derived therefrom. Moreover, only the beam axes of the measurement beam and sub-beams are shown to simplify the drawings. FIGS. 7A and 7B additionally show an x-reference plane 380 of metrology system 300 relative to which displacements of stage 50 are measured. X-reference plane 380 is oriented parallel to the y-z plane. In FIGS. 7A-7C, solid lines and reference numeral 151 indicate the position of grating 116 with metrology system 300 in calibration mode and broken lines and reference numeral 153 indicate the position of grating 116 with metrology system 300 in writing mode.

In metrology systems, such as above-described metrology systems 100, 200, based on the metrology system disclosed in above-mentioned United States patent application publication no. 2007/0146722, the measurement beams incident on diffraction grating 116 lie in the x-z plane, and remain in the x-y plane after diffraction by grating 116. In other words, the angles of incidence and diffraction of the measurement beams at grating 116 have a component of zero relative to x-z plane. In metrology systems, such as metrology system 300, based on the metrology system disclosed in U.S. patent application Ser. No. 11/686,855, the measurement beams and their respective sub-beams are incident on diffraction grating 116 at an angle of incidence having a non-zero component relative to the x-z plane. Grating 116 diffracts the measurement beams and their respective sub-beams at an angle of diffraction also having a non-zero component relative to the x-z plane.

As a result of the angle of incidence on grating 116 in metrology system 300 having a non-zero component relative to the x-z plane, the separation change between the calibration mode and the writing mode of metrology system 300 causes the offset displacement to be offset from the measured displacement by an offset having components both in the x-direction and the y-direction. Consequently, in metrology system 300, the offset displacement to which the offset calibration value pertains is offset from the measured displacement by an offset having components in both the x-direction and the y-direction.

Metrology system 300 generates an electrical signal notionally equivalent to that generated by interferometer assembly 113 or by interferometer assembly 213 in metrology system 200 described above with reference to FIG. 4 by diffraction grating 116 subjecting a respective measurement beam to diffractions of two different orders to generate two sub-beams from the measurement beam. A respective retroreflector reflects each of the sub-beams back to the grating. The grating diffracts each of the sub-beams in a manner that superposes the sub-beams at a detector. Embodiments of metrology system 300 configured for use in applications in which a separation change in the z-direction has to be measured in addition to displacement in the x-direction measure both displacement and separation change. An embodiment of metrology system 300 that only measures displacement interferometrically employs a single measurement beam and additionally comprises a separation change sensor similar to separation change sensor 110 described above with reference to FIG. 1 to measure separation change in the z-direction. An embodiment of metrology system 300 that measures both displacement and separation change interferometrically employs two measurement beams in a manner analogous to metrology system 200 described above with reference to FIG. 4.

FIG. 7A is a front elevation showing part of the paths of a measurement beam 370 and a first sub-beam 371 derived from measurement beam 370 in metrology system 300. Parameters pertaining to measurement beam 370 are indicated by a suffix A. Interferometer head 312 directs measurement beam 370 towards diffraction grating 116, where the measurement beam is incident on the diffractive surface 118 thereof at an angle of incidence having a component of $\alpha$ relative to the y-z plane. A typical value of $\alpha$ is 15°, although other values of $\alpha$ are possible and may be used. Diffraction grating 116 subjects part of measurement beam 370 to a first-order diffraction that forms first sub-beam 371. First sub-beam 371 has an angle of diffraction having a component of $\beta$ relative to the y-z plane. A typical value of $\beta$ is 20°, although other values of $\beta$ are possible and may be used. A retroreflector 390 reflects first sub-beam 371 back to grating 116, where first sub-beam 371 is incident at an angle of incidence having a component of $\beta$ relative to the y-z plane. Grating 116 subjects first sub-beam 371 to a first-order diffraction after which first sub-beam 371 is incident on a detector (not shown).

In the calibration mode of metrology system 300, measurement beam 370 is incident on grating 116 in a region of incidence $C1_{A1}$ and sub-beam 371 is incident on grating 116 in a region of incidence $C2_{A1}$. A mid-point between regions of incidence $C1_{A1}$ and $C2_{A1}$ is indicated by $C_{A1}$. In the writing mode of metrology system 300, measurement beam 370 is incident on grating 116 in a region of incidence $W1_{A1}$ and first sub-beam 371 is incident on grating 116 in a region of incidence $W2_{A1}$. A mid-point between regions of incidence $W1_{A1}$ and $W2_{A1}$ is indicated by $W_{A1}$. As a result of the change in separation between the calibration mode and the writing mode, regions of incidence $W1_{A1}$ and $W2_{A1}$ are offset in the x-direction from regions of incidence $C1_{A1}$ and $C2_{A1}$, respectively, by respective x-direction offset components. The x-direction offset components have an average value equal to the x-direction component $\Delta x_{A1}$ of the offset of mid-point $W_{A1}$ from mid-point $C_{A1}$. X-direction offset component $\Delta x_{A1}$ is related to z-direction separation change $\Delta z$ by $\Delta x_{A1} = \Delta z \tan \beta$.

FIG. 7B is a front elevation showing part of the paths of measurement beam 370 and a second sub-beam 373 derived from measurement beam 370 in metrology system 300. Measurement beam 370 is incident on the diffractive surface 118 of diffraction grating 116 at an angle of incidence having a component of $\alpha$ relative to the y-z plane, as described above. Diffraction grating 116 subjects part of measurement beam 370 to a zeroth-order diffraction (specular reflection) that forms second sub-beam 373 of first measurement beam 371. Second sub-beam 373 has an angle of diffraction having a component of $\alpha$ relative to the y-z plane. Retroreflector 392 reflects second sub-beam 373 back to grating 116, where second sub-beam 373 is incident at an angle of incidence having a component of $\alpha$ relative to the y-z plane. Grating 116 subjects second sub-beam 373 to a zeroth-order diffraction (not shown) after which second sub-beam 373 is incident on the same detector (not shown) as first sub-beam 371.

In the calibration mode of metrology system 300, measurement beam 370 is incident on grating 116 in a region of incidence $C1_{A0}$ and sub-beam 373 is incident on grating 116 in a region of incidence $C2_{A0}$. A mid-point between regions of incidence $C1_{A0}$ and $C2_{A0}$ is indicated by $C_{A0}$. In the writing mode of metrology system 300, measurement beam 370 is incident on grating 116 in a region of incidence $W1_{A0}$ and sub-beam 373 is incident on grating 116 in a region of incidence $W2_{A0}$. A mid-point between regions of incidence $W1_{A0}$ and $W2_{A0}$ is indicated by $W_{A0}$. Regions of incidence $W1_{A0}$ and $W2_{A0}$ are offset in the –x-direction from regions of incidence $C1_{A0}$ and $C2_{A0}$, respectively, by respective x-direction offset components. The x-direction offset components have an average value equal to the x-direction component $\Delta x_{A0}$ of the offset of mid-point $W_{A0}$ from mid-point $C_{A0}$. X-direction offset component $\Delta x_{A0}$ is related to z-direction separation change $\Delta z$ by $\Delta x_{A0} = \Delta z \tan \alpha$.

In an example in which metrology system 300 interferometrically measures both displacement and separation change, measurement beam 371 is a first measurement beam, the detector is a first detector, and interferometer head 312 comprises a second detector (not shown). Interferometer head 312 directs a second measurement beam (not shown) towards diffraction grating 116. The second measurement beam is incident on the diffractive surface 118 of the diffraction grating at an angle of incidence having a component relative to the y-z plane of $-\alpha$. Parameters pertaining to the second measurement beam are indicated by a suffix B. Grating 116 subjects part of the second measurement beam to a first-order diffraction to form a first sub-beam (not shown) of the second measurement beam. The first sub-beam of the second measurement beam has an angle of diffraction having a component of $-\beta$ relative to the y-z plane. Retroreflector 392 reflects the first sub-beam back to grating 116, where the first sub-beam is incident at an angle of incidence having a component of $-\beta$ relative to the y-z plane. Grating 116 subjects the first sub-beam of the second measurement beam to a first-order diffraction, after which the first sub-beam propagates at an angle of diffraction having a component of $-\alpha$ relative to the y-z plane. The first sub-beam is then incident on the second detector. The paths of the second measurement beam and first sub-beam thereof are mirror images of the paths of first measurement beam 370 and first sub-beam 371, respectively, described above with reference to FIG. 7A. The average x-direction component $\Delta x_{B1}$ of the offset between the regions of incidence of the second measurement beam and its first (zeroth-order) sub-beam on grating 116 between the calibration mode and the writing mode of metrology system 300 is related to z-direction separation change $\Delta z$ by $\Delta x_{B1} = -\Delta z \tan \beta$.

Additionally, in the example in which metrology system 300 interferometrically measures both displacement and separation change, grating 116 subjects part of the second measurement beam to a zeroth-order diffraction (specular reflection) to form a second sub-beam (not shown) of the second measurement beam. The second sub-beam of the second measurement beam has an angle of diffraction having a component of $\alpha$ relative to the y-z plane. Retroreflector 390 reflects the second sub-beam of the second measurement beam back to grating 116, where the second sub-beam is incident at an angle of incidence having a component of $\alpha$ relative to the y-z plane. Grating 116 subjects the second sub-beam of the second measurement beam to a zeroth-order diffraction, after which the second sub-beam propagates at an angle of diffraction having a component of $-\alpha$ relative to the y-z plane. The second sub-beam is then incident on the second detector. The paths of the second measurement beam and second sub-beam thereof are mirror images of the paths of first measurement beam 370 and second sub-beam 373, respectively, described above with reference to FIG. 7B. The average x-direction component $\Delta x_{B0}$ of the offset between the regions of incidence of the second measurement beam and its second (zeroth order) sub-beam between the calibration mode and the writing mode of metrology system 300 is related to z-direction separation change $\Delta z$ by $\Delta x_{B0} = -\Delta z \tan \alpha$.

Since the fringe count for the first measurement beam is determined from the first and second sub-beams of the first measurement beam, the x-direction component of the offset between the regions of incidence of the first measurement beam and its sub-beams due to a separation change of $\Delta z$ is given by:

$$\Delta x_A = \Delta x_{A1} - \Delta x_{A0} = +\Delta z (\tan \beta + \tan \alpha).$$

Also, since the fringe count for the second measurement beam is determined from the first and second sub-beams of the second measurement beam, the x-direction component of the offset between the regions of incidence of the second measurement beam and its sub-beams due to a separation change of $\Delta z$ is given by:

$$\Delta x_B = \Delta x_{B1} - \Delta x_{B0} = -\Delta z (\tan \beta + \tan \alpha).$$

FIG. 7C is a side elevation showing part of the paths of measurement beam 370 and first sub-beam 371 of measurement beam 370 in metrology system 300. These beam paths are also shown in front elevation in FIG. 7A. As shown in FIG. 7C, the angle of incidence of measurement beam 370 on the diffractive surface 118 of diffraction grating 116 has a non-zero component $\psi$ relative to the x-z plane. Consequently, the angle of diffraction of first sub-beam 371 of measurement beam 370 has a component $\omega$ relative to the x-z plane that is non-zero and not equal to the component $\psi$ of the angle of incidence.

For the first sub-beams of the first and second measurement beams, i.e., the sub-beams that are subject to first-order diffraction, the y-direction component $\Delta y_{A1}$ of the offset of the regions of incidence of the first sub-beam of the first measurement beam and the y-direction component $\Delta y_{B1}$ of the offset of the regions of incidence of the first sub-beam of the second measurement beam between the calibration mode and the writing mode of metrology system 300 are given by:

$$\Delta y_{A1} = \Delta y_{B1} = -\Delta z \tan \omega.$$

For the second sub-beams of the first and second measurement beams, i.e., the sub-beams that are subject to the zeroth order diffraction, the component of the angle of diffraction relative to the x-z plane is equal to the component of the angle of incidence relative to the x-z plane. Thus, the y-direction component $\Delta y_{A0}$ of the offset of the regions of incidence of the second sub-beam of the first measurement beam and the y-direction component $\Delta y_{B0}$ of the offset of the regions of incidence of the second sub-beam of the second measurement beam between the calibration mode and the writing mode of metrology system 300 are given by:

$$\Delta y_{A0} = \Delta y_{B0} = -\Delta z \tan \psi.$$

Since the fringe count for the first measurement beam is determined from the first and second sub-beams of the first measurement beam, the y-direction component of the offset between the regions of incidence of the first measurement beams and its sub-beams due to a change of separation of $\Delta z$ is given by:

$$\Delta y_A = \Delta y_{A1} - \Delta y_{A0} = \Delta z (\tan \psi - \tan \omega).$$

Also, since the fringe count for the second measurement beam is determined from the first and second sub-beams of the second measurement beam, the y-direction component of the offset between the regions of incidence of the second measurement beams and its sub-beams due to a change of separation of $\Delta z$ is given by:

$$\Delta y_B = \Delta y_{B1} - \Delta y_{B0} = \Delta z (\tan \psi - \tan \omega).$$

Typically, the components $\psi$ and $\omega$ relative to the x-z plane of the angle of incidence and the angle of diffraction, respectively, are very nearly equal. When components $\psi$ and $\omega$ are nearly equal, $(\tan \psi - \tan \omega)$ is very small. For example, in an embodiment of metrology system 300 in which the angle of incidence has a component $\alpha = 15°$ relative to the y-z plane and a component $\psi = 10°$ relative to the x-z plane, the angle of diffraction has a component $\beta = 20°$ relative to the y-z plane, the wavelength of the measurement beams is 1.55 µm and the pitch of grating 116 is 2.5909 µm, the component $\omega$ of the angle of diffraction relative to the x-z plane is 10.28°, and $(\tan \psi - \tan \omega)$ is 0.0050. Consequently, in many practical cases, the y-direction component of the offset can be ignored, and the offset displacement can be regarded as being offset from the measured displacement by an offset having only an x-direction component. Otherwise, the offset displacement is offset from the measured displacement by an offset having components in both the x-direction and the y-direction.

In metrology system 300, a processor similar to processor 220 described above with reference to FIG. 4 receives respective electrical signals from the above-described first detector and second detector and generates respective fringe counts as stage 50 moves. In the calibration mode of metrology system 300, the processor performs processing similar to that described above with reference to FIG. 6A to calculate and store fringe count differences linked to the known displacement of each measurement mark on the calibration wafer. Each original calibration value is composed of a first measurement beam calibration value component and a second measurement beam calibration value component. Each calibration value component is a fringe count difference for the respective measurement beam.

In embodiments of metrology system 300 that take account of the y-direction component of the offset in addition to the x-direction component thereof, an at least partial y-direction calibration is performed using a calibration wafer having at least two rows of measurement marks arrayed in the x-direction. The rows of measurement marks are arrayed in the y-direction.

In the writing mode of metrology system 300, the processor performs processing similar to that described above with reference to FIG. 6B to calculate a displacement value that accurately quantifies the displacement of stage 50. The processor performs processing similar to that describe above with reference to blocks 231 and 233 of FIG. 6B to determine a measured displacement $X_W$ and a separation change $\Delta z$ from the measured fringe counts. Since the x-direction components of the offsets for the first measurement beam and the second measurement beam are equal and opposite, in block 235, the processor uses the following equation to calculate an x-direction component of an x-direction offset component $\Delta x$ that is later used to determine the x-direction component of a respective offset displacement for each measurement beam:

$$\Delta x = \Delta z (\tan \beta + \tan \alpha).$$

In embodiments in which the y-direction components of the offset are taken into account, since the y-direction components of the offsets for the first measurement beam and the second measurement beam are equal in magnitude and direction, in block 235, the processor additionally uses the following equation to calculate a y-direction offset component $\Delta y$ that is later used to determine the y-direction component of the respective offset displacement for each measurement beam:

$$\Delta y = \Delta z (\tan \psi - \tan \omega).$$

The processor then performs processing similar to that described above with reference to blocks 237-247 of FIG. 6B to calculate the displacement value that accurately quantifies the displacement of stage 50. In block 237, the processor combines measured displacement $X_W$, x-direction offset component $\Delta x$ and, optionally, y-direction offset component $\Delta y$ to obtain an offset displacement for the first measurement beam and an offset displacement for the first measurement beam. Specifically, the x-direction offset component is combined in an additive sense to obtain the offset displacement for the first measurement beam and is combined in a subtractive sense to obtain the offset displacement for the second measurement beam. In one iteration of block 243, the processor calculates an offset calibration value component (CVC) for the first measurement beam by interpolation using the first measurement beam calibration value components of the original calibration values pertaining to known displacements bracketing the offset displacement calculated in block 237 for the first measurement beam. In the other iteration of block 243, the processor calculates an offset calibration component for the second measurement beam by interpolation using the second measurement beam calibration value components of the original calibration values pertaining to known displacements bracketing the offset displacement. In embodiments in which the offset displacements comprise a y-direction offset component, the interpolation is a two-dimensional interpolation in the x-direction and the y-direction.

In the above-described metrology systems, stage 50 may additionally be capable of large-scale movement in the y-direction, mutually orthogonal to the x- and z-directions, as noted above. A three-dimensional metrology system based on the above-described two-dimensional metrology systems 100, 200, 300 and suitable for measuring the displacement of stage 50 in at least the x- and y-directions is additionally composed of an additional interferometer head similar to interferometer head 112, 212 or 312, but oriented to measure displacement in the y-direction. The additional interferometer head directs respective measurement beams towards grating 116. In such an embodiment, grating 116 is a two-dimensional grating. In one example, the two-dimensional grating has lines extending in both the x-direction (for measuring displacement in the y-direction) and the y-direction (for measuring displacement in the x-direction). In another example, the two-dimensional grating has lines extending at an angle of 45° to the x- and y-directions. Alternatively, grating 116 is composed of a first grating having lines extending in the y-direction on which the measurement beams output by interferometer head 112, 212 or 312 are incident, and a second grating having lines extending the x-direction on which the measurement beams output by the additional interferometer head are incident.

The measurement beams output by the additional interferometer head are incident on grating 116 at a non-zero angle of incidence, as described above. In an example in which the additional interferometer head is based on that described in United States patent application publication no. 2007/0146722, the angle of incidence is equal to the Littrow angle.

The processor of such three-dimensional metrology system receives electrical signals from interferometer heads 112, 212 or 312 and from them measures the displacement of the stage in the x-direction. The processor then corrects the measured displacement in the x-direction using offset calibration values that pertain to displacements offset from the measured displacement in the x-direction, as described above. The processor additionally receives electrical signals from the additional interferometer head and from them measures the displacement of the stage in the y-direction. The processor then corrects the measured displacement in the y-direction using offset calibration values that pertain to displacements offset from the measured displacement in the y-direction.

Such a three-dimensional metrology system is calibrated in a manner similar to that described above, but uses a calibration wafer 60 in which the fiducial marks are arrayed in a two-dimensional array. Measurement marks arrayed in the x-direction on calibration wafer 60 will be regarded as constituting rows whereas those arrayed in the y-direction will be regarded as constituting columns. In the calibration process for a three-dimensional metrology system, the calibration process described above with reference to two-dimensional metrology systems 100, 200, 300 is repeated for each row of measurement marks on the calibration wafer. The separation of the stage remains unchanged throughout the calibration process. Each calibration value generated by the calibration process is composed of an x-direction displacement, a y-direction displacement, and a calibration value composed of four calibration value components. Each calibration value component is a fringe count difference for a respective one of the four measurement beams.

Figure 8:
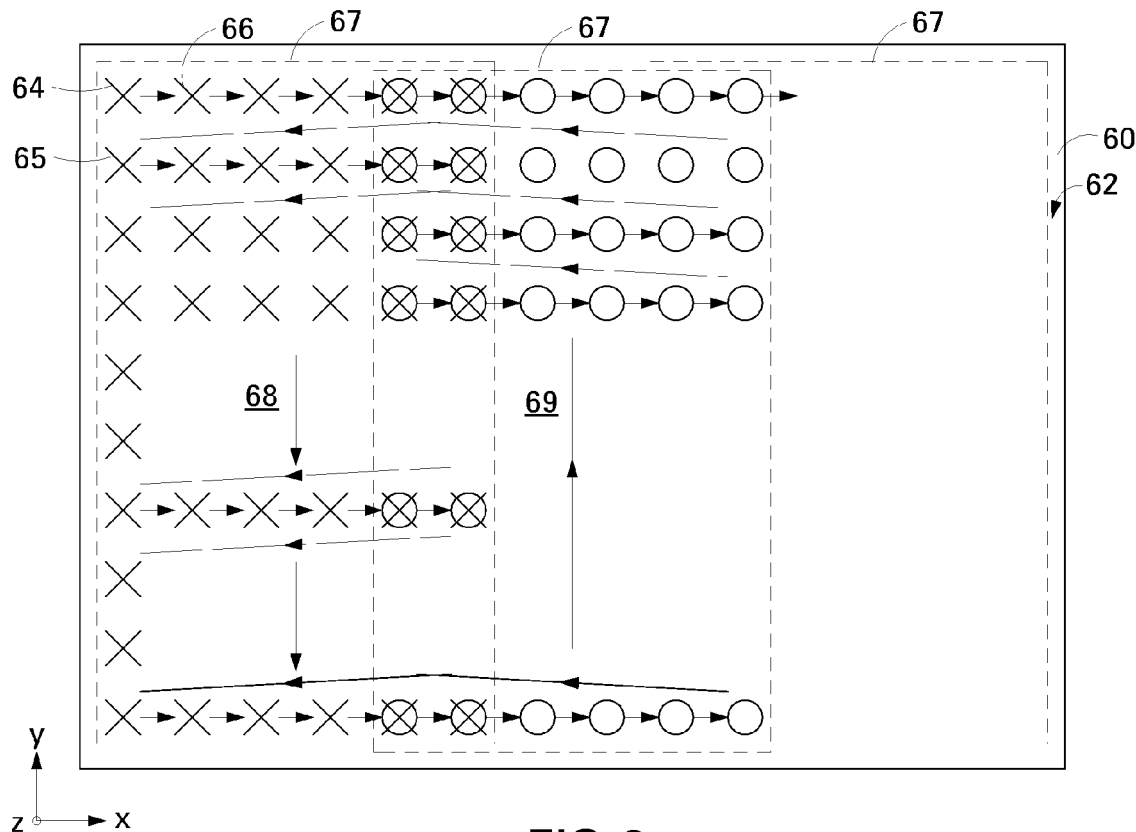
FIG. 8 is a plan view showing part of an example of a calibration wafer suitable for calibrating a three-dimensional embodiment of a metrology system in accordance with the invention.

Calibrating a three-dimensional metrology system takes substantially longer than calibrating a two-dimensional metrology system. In a two-dimensional metrology system, the time that elapses between measuring one measurement mark and the adjacent measurement mark is quite small. Consequently, even if measurement drift is a concern, the effect of drift on the calibration values pertaining to adjacent measurement marks between or among which interpolation is performed is quite small. The same is true of a three-dimensional metrology system with respect to the measured displacements of adjacent measurement marks in the same row on the calibration wafer. However, the same may not be true with respect to the measured displacements of adjacent measurement marks in the same column. This is because the time that elapses between making such measurements is equal to the time taken to measure the measured displacements of all the measurement marks in one row.

Where drift is a concern, a three-dimensional metrology system can be calibrated using the stripe-wise calibration scheme illustrated in FIG. 8. The stripe-wise calibration scheme reduces the maximum time that elapses between the displacement measurements of adjacent measurement marks in the same column. FIG. 8 is a plan view showing part of an example of calibration wafer 60 suitable for calibrating a three-dimensional embodiment of metrology system 100, 200 or 300. Located on the major surface 62 of calibration wafer 60 is a two-dimensional array of fiducial marks, including a reference mark 64 and measurement marks, an exemplary one of which is shown at 66. Reference numeral 66 will additionally be used to refer to the measurement marks collectively. Referring additionally to FIG. 4, calibration wafer 60 is shown in the orientation in which it would be mounted on the first major surface 52 of stage 50. In this orientation, the rows of measurement marks 66 are oriented parallel to the x-direction and the columns of the measurement marks are oriented parallel to the y-direction.

Measurement marks 66 on calibration wafer 60 are divided into a number of partially-overlapping elongate stripes 67, two adjacent ones of which are shown at 68 and 69. Stripes 67 extend in the y-direction and overlap in the x-direction. Reference mark 64 is also located in stripe 68. Those of the measurement marks 66 located exclusively within stripe 68 are represented by a cross and those of measurement marks 66 located exclusively within stripe 69 are represented by a circle. Those of the measurement marks 66 located within the partial overlap region between stripes 68 and 69, i.e., that are located within both stripe 68 and stripe 69, are represented by a cross and a circle.

Instead of obtaining a calibration value for every measurement mark in a row of reference marks on wafer 60 before obtaining a calibration value of the next row of measurement marks, the calibration method first obtains a calibration value only for those measurement marks in a row of reference marks located within stripe 68. Then, calibration values are obtained for the measurement marks in the next row within stripe 68. Calibration values are obtained for all the measurement marks within stripe 68 before a calibration value is obtained for a first measurement mark of the last row within stripe 69 offset from stripe 68 in the x-direction. The last two columns of stripe 68 are also the first two columns of stripe 69.

In the example shown in FIG. 8, stage 50 is moved in the x-direction and the −y direction to align reference mark 64 on calibration wafer 60 with optical system 40. Stage 50 is additionally moved in the z-direction to set the separation between stage 50 and interferometer head 112 and the additional interferometer head to the first separation at which the stage remains throughout the calibration process, as described above. A measurement mark process is then performed. In the measurement mark process, stage 50 is moved in the −x-direction to align measurement mark 66 with optical system 40, and metrology system 200 measures the displacement in the x-, y- and z-directions of measurement mark 66 from reference mark 64 and calculates a respective original calibration value that pertains to the known displacement of measurement mark 66. The measurement mark operation just described is then repeated to perform a strip row operation that obtains original calibration values pertaining to the respective known displacements of the remaining measurement marks in the same row as measurement mark 66 within stripe 68. Stage 50 then moves in the +y-direction and additionally in the −x-direction to align the first measurement mark 65 in the next row of measurement marks with optical system 40. The stripe row operation just described is then repeated to obtain original calibration values pertaining to the remaining measurement marks in the same row as measurement mark 65 within stripe 68. The stripe row operation is then repeated the requisite number of time to complete a stripe operation in which original calibration values pertaining to the respective known displacements of all the measurement marks within stripe 68 are obtained. After completion of each stripe row operation, stage 50 is moved in the y-direction and the −x-direction to align the first measurement mark in the next row with optical system 40.

Obtaining original calibration values for the last two measurement marks in the last row within stripe 68 additionally obtains original calibration values for the first two measurement marks of the last row within stripe 69. The original calibration values for the first two measurement marks in the last row within stripe 69 are obtained in consecutive measurement mark operations. An additional four measurement mark operations are performed with the stage continuing to move in the −x-direction to complete the stripe row operation for the last row within stripe 69. The requisite number of additional stripe row operations is performed to complete a stripe operation for stripe 69 in which original calibration values pertaining to the respective known displacements of all the measurement marks within stripe 69 are obtained. After each stripe row operation has been performed, stage 50 is moved in the −y-direction and the +x-direction to align the first measurement mark in the previous row with optical system 40.

A requisite number of stripe operations similar to that just described is performed to obtain calibration values for the measurement marks in all the remaining stripes 67 into which wafer 60 was divided.

In the following description, a unit of measurement time is the time taken to perform one measurement mark operation. In the example shown, in which, within each stripe 67, the rows are composed of six measurement marks 66 and two columns of measurement marks are common to adjacent stripes where the stripes overlap, pairs of measurement marks in the same column in adjacent rows differ in measurement time by six units of measurement time. Moreover, over the whole of calibration wafer 60, pairs of measurement marks in the same row in adjacent columns have measurement times that differ by only one unit of measurement time. The overlap between adjacent stripes makes the latter statement true. This enables the offset calibration values to be calculated by interpolation in both the x-direction and the y-direction between pairs of adjacent calibration values whose measurement times differ by no more than six units of measurement time. In a conventional calibration procedure, pairs of measurement marks in the same column in adjacent rows differ in measurement time by as many units of measurement time as the number of measurement marks in the row. Typically this number is substantially greater than six. By appropriately increasing the overlap between the stripes, interpolation schemes that involve a larger number of calibration values may be used. The execution time for a calibration scheme that uses partially-overlapped stripes as just described is greater than that of a conventional calibration scheme by a factor of 1+[n/(N−n)], where n is the number of columns common to adjacent stripes and N is the number of columns per stripe.

In the above description, the terms row and column may be interchanged. In this case, stripes 67 are oriented orthogonally to those shown. Moreover, only a respective displacement measurement need be performed with each measurement mark on test wafer 60 aligned with optical system 40. As described above, the processing that determines the respective original calibration values from the measured displacements obtained from the displacement measurements can be performed after all or some of the displacement measurements have been performed.

In the above-described embodiments of metrology systems 100, 200, 300, processors 120 and 220 may be implemented in hardware such as an integrated circuit having bipolar, N-MOS, P-MOS or CMOS devices. Design libraries comprising designs for circuit elements suitable for implementing the above-described functions of processors 120, 220 are commercially available can be used to design such hardware implementations of processors 120, 220.

Processors 120, 220 may alternatively be implemented in pre-fabricated hardware devices such as an application-specific integrated circuit (ASIC) or a field-programmable gate array (FPGA). Design libraries comprising designs for implementing the above-described functions of processors 120, 220 in such pre-fabricated hardware devices are commercially available can be used to configure such pre-fabricated hardware devices to implement the functions of processors 120, 220.

Processors 120, 220 can alternatively be implemented in software running on a suitable computational device (not shown) such as a microprocessor or a digital signal processor (DSP). Processors 120, 220 may additionally constitute part of a digital signal processor. Programming modules capable of programming a computational device to provide the above-described functions of processors 120, 220 are commercially available and may be used to program a computational device to provide a software implementation of processors 120, 220. In such software implementations of processors 120, 220, the various functions described in this disclosure are typically ephemeral, and operate only temporarily as the program executes.

The program in response to which the computational device operates can be fixed in a suitable computer-readable medium (not shown) such as a floppy disk, a hard disk, a CD-ROM, a DVD-ROM, a flash memory, a read-only memory or a programmable read-only memory. The program is then transferred from the computer-readable medium to a non-volatile memory that forms part of the computational device, or is external to the computational device. Alternatively, the program can be transmitted to the non-volatile memory of the computational device by a suitable data link.

FIG. 9 is a flow chart showing an example 400 of an interferometer-based metrology method in accordance with an embodiment of the invention for measuring a displacement of an object, such as a stage. The object is movable in a first direction and in a second direction, different from the first direction. In block 410, a metrology system is provided. The metrology system comprises a diffraction grating mounted on the object, and an interferometer head operable to direct at least one measurement light beam towards the grating at a non-zero angle of incidence. In block 420, with a single first separation in the second direction between the interferometer head and the object, respective displacement measurements are made at known displacements of the object in the first direction. In block 430, respective original calibration values are derived from the displacement measurements. Each of the original calibration values pertains to a respective one of the known displacements. In block 440, with a second separation in the second direction between the object and the interferometer head, a displacement of the object is measured to obtain a measured displacement. The second separation differs from the first separation. In block 450, the measured displacement is corrected using an offset calibration value derived from at least one of the original calibration values and pertaining to at least one offset displacement. Each offset displacement is offset from the measured displacement.

The operations performed in block 420 and block 430 generate a single set of original calibration values. Each of the original calibration values pertains to a respective known displacement of the object in the first direction and the single first separation in the second direction between the interferometer head and the object on which the diffraction grating is mounted. In block 440, the displacement of the object is measured with the second separation between the object and the interferometer head to obtain a measured displacement. In block 450, the measured displacement measured in block 440 is corrected using an offset calibration value derived from one or more of the original calibration values. Correcting the measured displacement provides a displacement value that quantifies the displacement of the object more accurately than the measured displacement. Unlike in a conventional metrology system, the offset calibration value does not pertain to the measured displacement obtained in block 440. Instead, the offset calibration value pertains to at least one offset displacement. Each offset displacement is offset from the measured displacement. Using such an offset calibration value pertaining to at least one offset displacement offset from the measured displacement allows a single set of calibration values to be used regardless of the difference between the second separation and the first separation. No additional measurements are needed to obtain sets of calibration values pertaining to different separations have to be performed during calibration. Instead, all that is needed to obtain the offset calibration value from one or more of the original calibration values is a quantification of a separation change between the second separation and the first separation. This quantification can be obtained using a second interferometer head, or another device capable of measuring the separation change of the object in the second direction.

In metrology system 100 described above with reference to FIG. 1, an interferometer head composed of a single interferometer assembly is used to measure the displacement of the object, i.e., the stage 50, in the first direction, i.e., the x-direction. In this, the offset calibration value used to correct the measured displacement pertains to a single offset displacement offset from the measured displacement by an offset that depends on the change in separation between the displacement measurements performed in block 420 and the displacement measurement performed in block 440. In metrology system 200 described above with reference to FIG. 4, an interferometer head composed of two interferometer assemblies is used to measure the displacement of the object, i.e., stage 50, in the first direction. In this, the offset calibration value used to correct the measured displacement pertains to two offset displacements, one for each interferometer head. The offset displacements are offset in the positive first direction (+x-direction) and the negative first direction (−x-direction), respectively, from the measured displacement by an offset that depends on the change in separation between the displacement measurements performed in block 420 and the displacement measurement performed in block 440. In metrology system 300 described above with reference to FIGS. 7A-7C, an interferometer head is used to measure the displacement of the object, i.e., stage 50, in the first direction. In this, the offset calibration value used to correct the measured displacement pertains to two offset displacements, one for each measurement beam. The offset displacements are offset in the positive first direction (+x-direction) and the negative first direction (−x-direction), respectively, from the measured displacement by an offset that depends on the change in separation between the displacement measurements performed in block 420 and the displacement measurement performed in block 440. The offset displacements are additionally offset in the third direction (y-direction) from the measured displacement by an offset that depends on the change in separation between the displacement measurements performed in block 420 and the displacement measurement performed in block 440. In some embodiments of metrology system 300, the offset of the offset displacements in the third direction is ignored.

This disclosure describes the invention in detail using illustrative embodiments. However, the invention defined by the appended claims is not limited to the precise embodiments described.

Mathematical Appendix

1. Metrology System 200

The following analysis applies to metrology system 200 described above with reference to FIG. 4. An analysis of metrology system 100 described above with reference to FIG. 1 can be derived from the following analysis. An a (i) Calibration Mode In calibration mode, metrology system 200 measures the displacement of stage 50 with stage 50 at a separation $Z_C$ from interferometer head 212. Each resulting calibration value is composed of two calibration value components. The calibration value components are respective fringe count differences pertaining to regions of grating 116 on which measurement beam 170 directed by interferometer assembly 113 and measurement beam 270 directed by interferometer assembly 213, respectively, are incident. During calibration, both fringe count differences are calculated from the measured displacement of a single measurement mark on the calibration wafer and the known displacement of the measurement mark.

During calibration, stage 50 is set to separation $Z_C$ from interferometer head 212, and is moved first to align the reference mark on calibration wafer 60 with optical system 40 and then to align one of the measurement marks on calibration wafer 60 with the optical system. Denote the known displacement of the measurement mark as $(X_C, Z_C)$, and the measured displacement of the measurement mark as measured by metrology system 200 as $(X_M, Z_M)$. Let the fringe counts for interferometer assemblies 113, 213 generated by processor 220 in response to the electrical signals received from the respective interferometer assemblies and corresponding to the displacement of the measurement mark from the reference mark be $N_A$, $N_B$, respectively. Let the fringe count differences generated by processor 220 in response to fringe counts $N_A$, $N_B$ and known displacement $(X_C, Z_C)$ be $E_A[X_C]$ and $E_B[X_C]$. The pitch of grating 116 is p. The angle of incidence of measurement beams 170, 270 on grating 116 is α.

Then:

$$N_A = -\frac{2X_C}{p} - \frac{2Z_C \cot\alpha}{p} + E_A[X_C] = -\frac{2X_M}{p} - \frac{2Z_M \cot\alpha}{p}, \quad (1)$$

and $$N_B = +\frac{2X_C}{p} - \frac{2Z_C \cot\alpha}{p} + E_B[X_C] = +\frac{2X_M}{p} - \frac{2Z_M \cot\alpha}{p}. \quad (2)$$

Hence, fringe count differences $E_A[X_C]$ and $E_B[X_C]$ are given by:

$$E_A[X_C] = \frac{2}{p}\{+(X_C - Z_M) + (Z_C - Z_M)\cot\alpha\}, \quad (3)$$

and $$E_B[X_C] = \frac{2}{p}\{-(X_C - Z_M) + (Z_C - Z_M)\cot\alpha\}. \quad (4)$$

Thus, during calibration, fringe count differences $E_A$ and $E_B$ are characterized as functions of $X_C$, referred to the plane $z=Z_C$.

(ii) Writing Mode

In writing mode, metrology system 200 measures the displacement of stage 50 with stage 50 at a separation $Z_W$ from interferometer head 212. Separation $Z_W$ differs from separation $Z_C$ at which metrology system 200 was calibrated by separation change Δz. As a result of the separation change, and as shown in FIG. 5, region of incidence $W_A$ in which measurement beam 170 is incident on grating 116 at separation $Z_W$ is shifted to the right relative to region of incidence $C_A$ in which measurement beam 170 was incident during calibration at separation $Z_C$ by a distance Δz tan α. Similarly, region of incidence $W_B$ in which measurement beam 270 is incident on grating 116 at separation $Z_W$ is shifted to the left relative to region of incidence $C_B$ in which measurement beam 270 was incident during calibration at separation $Z_C$ by a distance Δz tan α. Let $X_V$ be the displacement value that accurately quantifies the displacement of stage 50, and $Z_V$ be the separation change value that accurately quantifies the separation change of the stage.

The fringe count equations corresponding to equations (1) and (2) are:

$$N_A = -\frac{2X_W}{p} - \frac{2Z_W \cot\alpha}{p} + E_A[X_W - \Delta z \tan\alpha] \quad (5)$$
$$= -\frac{2X_V}{p} - \frac{2Z_V \cot\alpha}{p},$$

and $$N_B = +\frac{2X_W}{p} - \frac{2Z_W \cot\alpha}{p} + E_B[X_W - \Delta z \tan\alpha] \quad (6)$$
$$= +\frac{2X_V}{p} - \frac{2Z_V \cot\alpha}{p}.$$

Therefore, displacement value $X_V$ is given by:

$$X_V = X_W + \frac{p}{4}\{+E_B[X_W - \Delta z \tan\alpha] - E_A[X_W + \Delta z \tan\alpha]\}. \quad (7)$$

And separation change value $Z_V$ is given by:

$$Z_V = Z_W + \frac{p\tan\alpha}{4}\{-E_B[X_W - \Delta z \tan\alpha] - E_A[X_W + \Delta z \tan\alpha]\}. \quad (8)$$

2. Metrology System 300

The following analysis applies to metrology system 300 described above with reference to FIGS. 7A-7C. The analysis assumes that that each original calibration value is composed of two calibration value components, one for the first measurement beam for which parameters are denoted by a suffix "A", and one for the second measurement beam for which parameters are identified by a suffix "B". For the original calibration value pertaining to the known displacement of each measurement mark on the calibration wafer, both calibration value components are obtained in a single calibration operation.

(i) Calibration Mode

In calibration mode, metrology system 300 measures the displacement of stage 50 with stage 50 at a separation $Z_C$ from interferometer head 312. Each resulting calibration value is composed of two calibration value components. The calibration value components are respective fringe count differences pertaining to the regions of grating 116 on which first measurement beam 370 and its sub-beams 371 and 373 are incident, and the regions of grating 116 on which the second measurement beam and its sub-beams are incident. During calibration, both fringe count differences are calculated from the measured displacement of a single measurement mark on the calibration wafer and the known displacement of the measurement mark.

During calibration, stage 50 is set to separation $Z_C$ from interferometer head 312, and is moved first to align the reference mark on calibration wafer 60 with optical system 40 and then to align one of the measurement marks on calibration wafer 60 with the optical system. Denote the known displacement of the measurement mark as $(X_C, Z_C)$, and the measured displacement of the measurement mark as measured by metrology system 300 as $(X_M, Z_M)$. Let the fringe counts corresponding to this measurement beam be $N_A$ for the first measurement beam and $N_B$ for the second measurement beam. Let the original calibration components expressed in terms of fringe count, for the first measurement beam and the second measurement beam be $E_A(X_C)$ and $E_B(X_C)$, respectively. The pitch of the grating is p. Then:

$$N_A = -\frac{2X_C}{p} - \frac{2Z_C \cot\frac{1}{2}(\alpha-\beta)}{p} + E_A(X_C) \qquad (1)$$

$$= -\frac{2X_M}{p} - \frac{2Z_M \cot\frac{1}{2}(\alpha-\beta)}{p},$$

and $$N_B = +\frac{2X_C}{p} - \frac{2Z_C \cot\frac{1}{2}(\alpha-\beta)}{p} + E_B(X_C) \qquad (2)$$

$$= +\frac{2X_M}{p} - \frac{2Z_M \cot\frac{1}{2}(\alpha-\beta)}{p}.$$

Hence, fringe count differences $E_A[X_C]$ and $E_B[X_C]$ are given by:

$$E_A[X_C] = \frac{2}{p}\left\{+(X_C - X_M) + (Z_C - Z_M)\cot\frac{1}{2}(\alpha-\beta)\right\}, \qquad (3)$$

and $$E_B[X_C] = \frac{2}{p}\left\{-(X_C - X_M) + (Z_C - Z_M)\cot\frac{1}{2}(\alpha-\beta)\right\}. \qquad (4)$$

Thus, during calibration, fringe count differences $E_A$ and $E_B$ are characterized as functions of $X_C$, referred to the plane $z=Z_C$.

(ii) Writing Mode

In writing mode, metrology system 300 measures the displacement of stage 50 with stage 50 at a separation $Z_W$ from interferometer head 312. Separation $Z_W$ differs from separation $Z_C$ at which metrology system 300 was calibrated by separation change $\Delta z$. As a result of the separation change, and as shown in FIGS. 7A and 7B, the regions of incidence in which the first measurement beam 170 and its sub-beams are incident on grating 116 at separation $Z_W$ are shifted relative to the regions of incidence in which the first measurement beam and its sub-beams were incident during calibration at separation $Z_C$ by an offset of $\Delta z(\tan\alpha + \tan\beta)$. Similarly, the regions of incidence in which the second measurement beam and its sub-beams are incident on grating 116 at separation $Z_W$ are shifted relative to the region of incidence in which the second measurement beam and its sub-beams were incident during calibration at separation $Z_C$ by an offset of $\Delta z(\tan\alpha + \tan\beta)$. Let $X_V$ be the displacement value that accurately quantifies the displacement of stage 50, and $Z_V$ be the separation change value that accurately quantifies the separation change of the stage.

The fringe count equations corresponding to equations (1) and (2) are:

$$N_A = -\frac{2X_W}{p} - \frac{2Z_W \cot\frac{1}{2}(\alpha-\beta)}{p} + \qquad (5)$$

$$E_A\left[\begin{array}{c} X_W + \Delta z \\ (\tan\alpha + \tan\beta) \end{array}\right] - \frac{2X_V}{p} - \frac{2Z_V \cot\frac{1}{2}(\alpha-\beta)}{p},$$

and $$N_B = +\frac{2X_W}{p} - \frac{2Z_W \cot\frac{1}{2}(\alpha-\beta)}{p} + E_B\left[\begin{array}{c} X_W - \Delta z \\ (\tan\alpha + \tan\beta) \end{array}\right] \qquad (6)$$

$$= +\frac{2X_V}{p} - \frac{2Z_V \cot\frac{1}{2}(\alpha-\beta)}{p}.$$

Therefore, displacement value $X_V$ is given by:

$$X_V = X_W + \frac{p}{4}\left\{+E_B\left[\begin{array}{c} X_W - \Delta z \\ (\tan\alpha + \tan\beta) \end{array}\right] - E_A\left[\begin{array}{c} X_W - \Delta z \\ (\tan\alpha + \tan\beta) \end{array}\right]\right\}. \qquad (7)$$

And separation change value $Z_V$ is given by:

$$Z_V = Z_W + \frac{p\tan\frac{1}{2}(\alpha-\beta)}{4}\left\{\begin{array}{c} -E_B\left[\begin{array}{c} X_W - \Delta z \\ (\tan\alpha + \tan\beta) \end{array}\right] - \\ E_A\left[\begin{array}{c} X_W - \Delta z \\ (\tan\alpha + \tan\beta) \end{array}\right] \end{array}\right\}. \qquad (8)$$

I claim:

1. A metrology system, comprising:
   an object movable in a first direction and in a second direction different from the first direction;
   a diffraction grating mounted on the object;
   a interferometer head operable to direct a measurement light beam towards the grating at a non-zero angle of incidence and to generate a first signal in response to movement of the object;
   a separation change detector operable to generate a second signal in response to changes in separation between the object and the interferometer head;
   stored calibration values pertaining to respective known displacements, the calibration values derived from displacement measurements made with a single first separation in the second direction between the interferometer head and the grating, each of the calibration values pertaining to a respective one of the known displacements; and a processor connected to receive the first and second signals generated as the object moves at least in the second direction to a second separation from the interferometer head, the second separation different from the first separation, the processor operable in response to the first signal and the second signal to measure a displacement of the object in the first direction as a measured displacement and to measure a separation change, the processor additionally operable to calculate an offset from the separation change and to determine at least one offset displacement from the measured displacement and the offset, the processor additionally operable to derive from at least one of the original calibration values an offset calibration value pertaining to the at least one offset displacement, and to correct the measured displacement using the offset calibration value.

2. The system of claim 1, in which the interferometer head comprises a single-pass interferometer assembly.

3. The system of claim 1, in which the interferometer head comprises a double-pass interferometer assembly.

4. The system of claim 1, in which the measurement beam is incident on the diffraction grating at the Littrow angle.

5. The system of claim 1, in which: the interferometer head comprises a first interferometer assembly and a second interferometer assembly; the first interferometer assembly is operable to direct the measurement light beam towards the grating and to generate the first signal; the second interferometer assembly is operable to direct an additional measurement light beam towards the grating at a non-zero angle of incidence and to generate a third signal in response to movement of the object; and the separation change detector comprises the first interferometer assembly, the second interferometer assembly and processing performed by the processor to generate the second signal from the first signal and the third signal.

* * * * *